United States Patent
Huang et al.

(10) Patent No.: US 12,082,510 B2
(45) Date of Patent: Sep. 3, 2024

(54) MAGNETIC TUNNEL JUNCTION DEVICE AND METHOD OF FORMING THE SAME

(71) Applicant: Taiwan Semiconductor Manufacturing Co., Ltd., Hsinchu (TW)

(72) Inventors: Chih-Fan Huang, Kaohsiung (TW); Kai-Wen Cheng, Taichung (TW); Chen-Chiu Huang, Taichung (TW); Dian-Hau Chen, Hsinchu (TW); Yen-Ming Chen, Chu-Pei (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 377 days.

(21) Appl. No.: 17/377,737

(22) Filed: Jul. 16, 2021

(65) Prior Publication Data
US 2022/0310903 A1    Sep. 29, 2022

Related U.S. Application Data

(60) Provisional application No. 63/166,369, filed on Mar. 26, 2021.

(51) Int. Cl.
| | | |
|---|---|---|
| H10N 50/80 | (2023.01) | |
| H10B 61/00 | (2023.01) | |
| H10N 50/01 | (2023.01) | |
| H10N 50/10 | (2023.01) | |

(52) U.S. Cl.
CPC ............ *H10N 50/80* (2023.02); *H10B 61/00* (2023.02); *H10B 61/22* (2023.02); *H10N 50/01* (2023.02); *H10N 50/10* (2023.02)

(58) Field of Classification Search
CPC ........ H10N 50/80; H10N 50/01; H10B 61/00; H10B 61/22
USPC .......................................................... 257/427
See application file for complete search history.

(56) References Cited

U.S. PATENT DOCUMENTS

| | | | |
|---|---|---|---|
| 2017/0018706 A1* | 1/2017 | Xue ..................... | H01F 10/14 |
| 2018/0158867 A1 | 6/2018 | Kim et al. | |
| 2018/0342669 A1 | 11/2018 | Kim et al. | |
| 2019/0221732 A1* | 7/2019 | Houssameddine ..... | G11C 11/16 |
| 2020/0176041 A1 | 6/2020 | Shen et al. | |
| 2021/0143323 A1* | 5/2021 | Kim ..................... | H10N 50/01 |
| 2021/0226118 A1 | 7/2021 | Peng et al. | |
| 2022/0044717 A1* | 2/2022 | Huang .................. | G11C 11/161 |
| 2022/0115583 A1* | 4/2022 | Wang .................... | H10B 61/00 |
| 2022/0140228 A1* | 5/2022 | Hsiao ................... | H10N 50/85 257/421 |
| 2022/0238438 A1* | 7/2022 | Lee .................. | H01L 21/76888 |

FOREIGN PATENT DOCUMENTS

| | | |
|---|---|---|
| DE | 102019126464 A1 | 6/2020 |
| KR | 20180064828 A | 6/2018 |
| KR | 20180129303 A | 12/2018 |

* cited by examiner

*Primary Examiner* — Jami Valentine Miller
(74) *Attorney, Agent, or Firm* — Slater Matsil, LLP

(57) ABSTRACT

A semiconductor device comprises a first conductive feature on a semiconductor substrate, a bottom electrode on the first conductive feature, a magnetic tunnel junction (MTJ) stack on the bottom electrode, and a top electrode on the MTJ stack. A spacer contacts a sidewall of the top electrode, a sidewall of the MTJ stack, and a sidewall of the bottom electrode. A conductive feature contacts the top electrode.

20 Claims, 29 Drawing Sheets

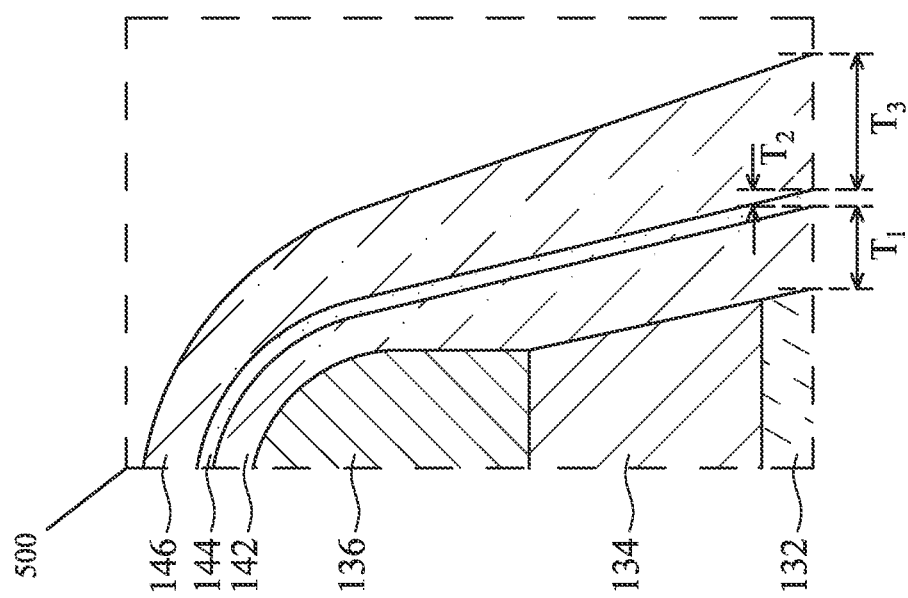

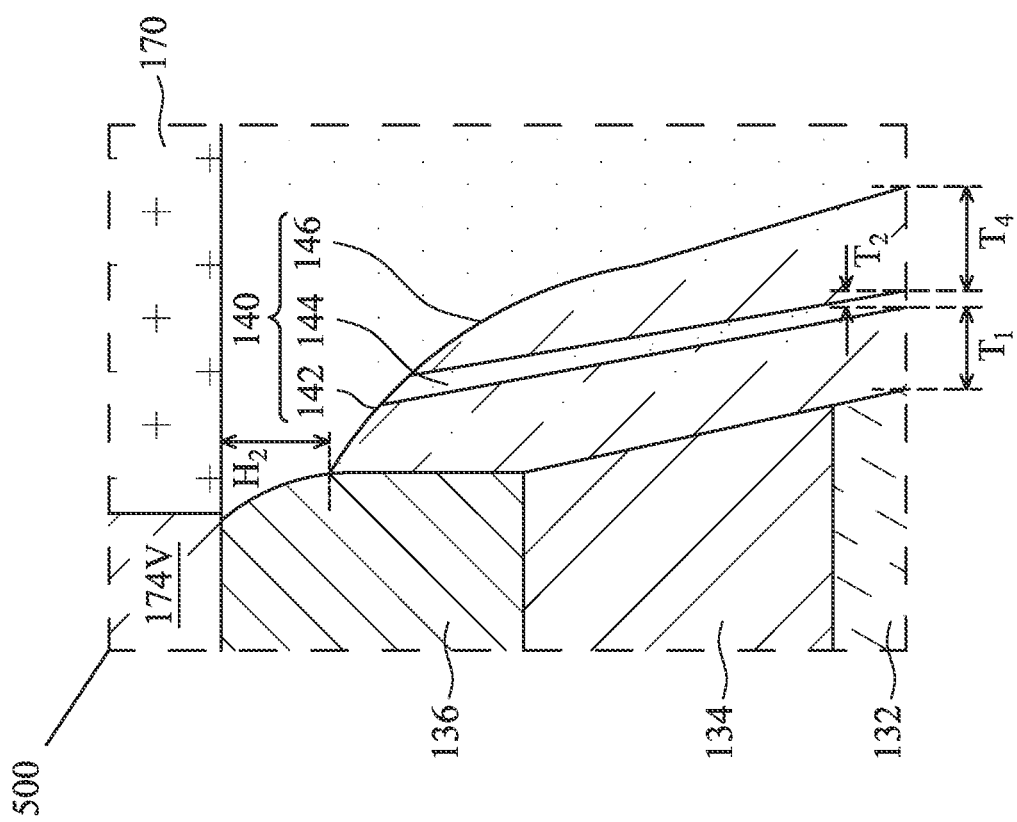

MAGNETIC TUNNEL JUNCTION DEVICE AND METHOD OF FORMING THE SAME

PRIORITY CLAIM AND CROSS-REFERENCE

This application claims the benefit of U.S. Provisional Application No. 63/166,369, filed on Mar. 26, 2021, which application is hereby incorporated herein by reference.

BACKGROUND

Semiconductor memories are used in integrated circuits for electronic applications, including radios, televisions, cell phones, and personal computing devices, as examples. One type of semiconductor memory is magnetoresistive random access memory (MRAM), which involves spin electronics that combines semiconductor technology and magnetic materials and devices. The spins of electrons, through their magnetic moments, are used to indicate bit values. A MRAM cell typically includes a magnetic tunnel junction (MTJ) stack, which includes two ferromagnets separated by a thin insulator.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3, 4, 5, 6, 7, 8, 9, 10A, 10B, 11A, 11B, 12, 13, 14, 15, 16A, and 16B are cross-sectional views of intermediate stages in the manufacturing of a semiconductor device, in accordance with some embodiments.

DETAILED DESCRIPTION

Figure 1:
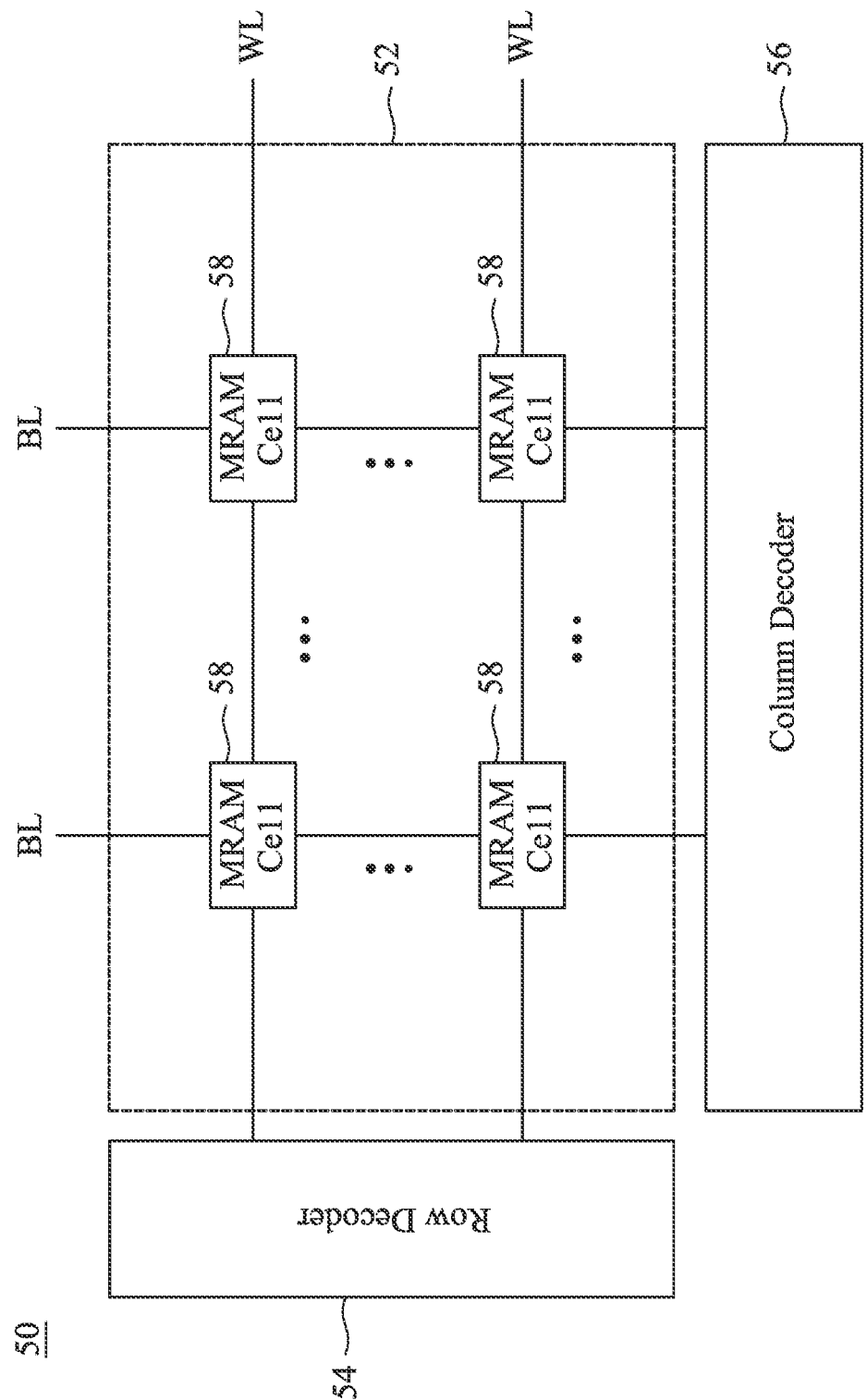
FIG. 1 is a block diagram of a semiconductor device, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, an interconnect structure for an integrated circuit is formed, and MTJ stacks are formed in memory regions of the interconnect structure. The MTJ stacks are used to form MRAM cells in the interconnect structure. Spacers are formed over the MRAM cells, such as around the MTJ stacks, to protect sidewalls of the MTJ stacks from moisture and hydrogen. In some embodiments, the spacers include a metal layer between nitride layers to absorb moisture and hydrogen, and prevent deoxygenation of features of the MRAM cells. Inclusion of the metal layers in the spacers may allow the nitride layers to be formed to a smaller thickness, which may reduce bombardment damage of the sidewalls of the MTJ stacks during formation of the nitride layers. In some embodiments, the spacers comprise carbon layers, which may increase the density of the spacers and reduce bombardment damage of the sidewalls of the MTJ stacks during formation of the carbon layer.

FIG. 1 is a block diagram of a semiconductor device 50, in accordance with some embodiments. The semiconductor device 50 includes a MRAM array 52, a row decoder 54, and a column decoder 56. The MRAM array 52 includes MRAM cells 58 arranged in rows and columns. The row decoder 54 may be, e.g., a static CMOS decoder, a pseudo-NMOS decoder, or the like. During operation, the row decoder 54 selects desired MRAM cells 58 in a row of the MRAM array 52 by activating the respective word line WL for the row. The column decoder 56 may be, e.g., a static CMOS decoder, a pseudo-NMOS decoder, or the like, and may include writer drivers, sense amplifiers, combinations thereof, or the like. During operation, the column decoder 56 selects bit lines BL for the desired MRAM cells 58 from columns of the MRAM array 52 in the selected row, and reads data from or writes data to the selected MRAM cells 58 with the bit lines BL.

Figure 2:
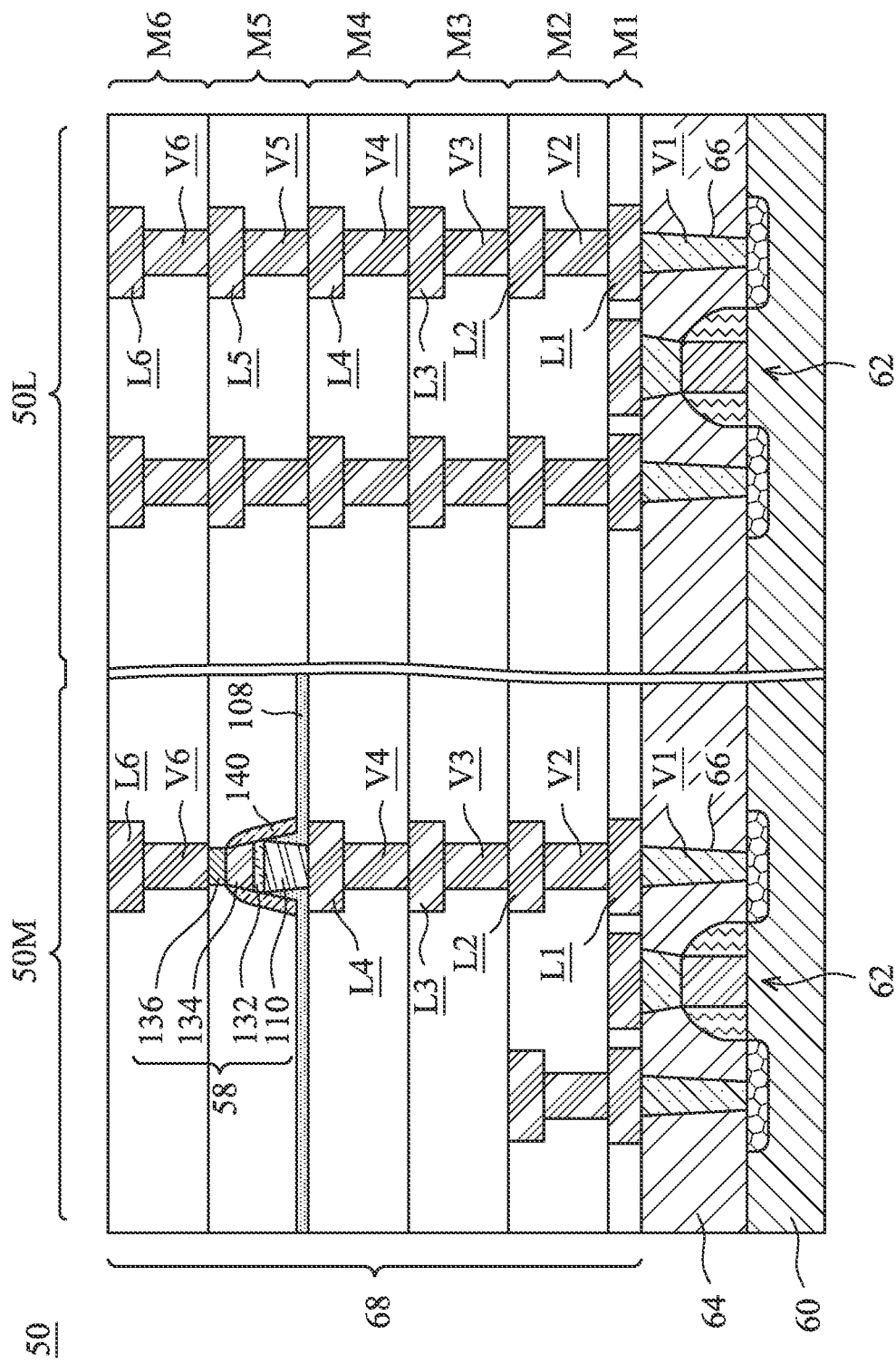
FIG. 2 is a cross-sectional view of a semiconductor device, in accordance with some embodiments.

FIG. 2 is a cross-sectional view of the semiconductor device 50, in accordance with some embodiments. FIG. 2 is a simplified view, and some features of the semiconductor device 50 (discussed below) are omitted for clarity of illustration. The semiconductor device 50 includes a logic region 50L and a memory region 50M. Memory devices (e.g., MRAMs) are formed in the memory region 50M and logic devices (e.g., logic circuits) are formed in the logic region 50L. For example, the MRAM array 52 (see FIG. 1) can be formed in the memory region 50M, and the row decoder 54 and the column decoder 56 (see FIG. 1) can be formed in the logic region 50L. The logic region 50L may occupy most of the area of the semiconductor device 50. For example, the logic region 50L may occupy from 95% to 99% of the area of the semiconductor device 50, with the memory region 50M occupying the remaining area of the semiconductor device 50. The memory region 50M can be disposed at an edge of the logic region 50L, or the logic region 50L can surround the memory region 50M.

The logic region 50L and memory region 50M are formed over a same substrate, e.g., a semiconductor substrate 60. The semiconductor substrate 60 may be silicon, doped or undoped, or an active layer of a semiconductor-on-insulator (SOI) substrate. The semiconductor substrate 60 may include other semiconductor materials, such as germanium; a compound semiconductor including silicon carbide, gallium arsenide, gallium phosphide, gallium nitride, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multilayered or gradient substrates, may also be used.

Devices 62 are formed at the active surface of the semiconductor substrate 60. The devices 62 may be active devices or passive devices. For example, the electrical components may be transistors, diodes, capacitors, resistors, or the like, formed by any suitable formation method. The devices 62 are interconnected to form the memory devices and logic devices of the semiconductor device 50. For example, some of the devices 62 may be access transistors for the MRAM cells 58.

One or more inter-layer dielectric (ILD) layer(s) 64 are formed on the semiconductor substrate 60, and electrically conductive features, such as contact plugs 66, are formed physically and electrically coupled to the devices 62. The ILD layer(s) 64 may be formed of any suitable dielectric material, for example, an oxide such as silicon oxide, phosphosilicate glass (PSG), borosilicate glass (BSG), boron-doped phosphosilicate glass (BPSG), or the like; a nitride such as silicon nitride; or the like. The ILD layer(s) may be formed by any suitable deposition process, such as spin coating, physical vapor deposition (PVD), chemical vapor deposition (CVD), the like, or a combination thereof. The electrically conductive features in the ILD layer(s) may be formed through any suitable process, such as deposition, damascene (e.g., single damascene, dual damascene, etc.), the like, or combinations thereof.

An interconnect structure 68 is formed over the semiconductor substrate 60, e.g., over the ILD layer(s) 64. The interconnect structure 68 interconnects the devices 62 to form integrated circuits in each of the logic region 50L and memory region 50M. The interconnect structure 68 includes multiple metallization layers M1-M6. Although six metallization layers are illustrated, it should be appreciated that more or less metallization layers may be included. Each of the metallization layers M1-M6 includes metallization patterns in dielectric layers. The metallization patterns are electrically coupled to the devices 62 of the semiconductor substrate 60, and include, respectively, metal lines L1-L6 and vias V1-V6 formed in one or more inter-metal dielectric (IMD) layers. The interconnect structure 68 may formed by a damascene process, such as a single damascene process, a dual damascene process, or the like. In some embodiments, the contact plugs 66 are also part of the metallization patterns, such as part of the lowest layer of metal vias V1.

The MRAM cells 58 of the MRAM array 52 (see FIG. 1) are formed in the interconnect structure 68. The MRAM cells 58 can be formed in any of the metallization layers M1-M6, and are illustrated as being formed in an intermediate metallization layer M5. Each MRAM cell 58 includes a conductive via 110, a bottom electrode 132 on the conductive via 110, a MTJ element 134 on the bottom electrode 132, and a top electrode 136 on the MTJ element 134. Another IMD layer 108 can be formed around the MRAM cells 58, with the conductive via 110 extending through the IMD layer 108. Spacers 140 can also be formed around the MRAM cells 58. The IMD layer 108 and/or spacers 140 surround and protect the components of the MRAM cells 58. The resistance of an MTJ element 134 is programmable, and can be changed between a high resistance ($R_{AP}$), which can signify a code such as a "1," and a low resistance ($R_P$), which can signify a code such as a "0." As such, a code can be written to an MRAM cell 58 by programming the resistance of its MTJ element 134 with its corresponding access transistor, and a code can be read from an MRAM cell 58 by measuring the resistance of its MTJ element 134 with its corresponding access transistor.

The MRAM cells 58 are electrically coupled to the devices 62. The conductive via 110 is physically and electrically coupled to an underlying metallization pattern, such as to the metal lines L4 in the illustrated example. The top electrode 136 is physically and electrically coupled to an overlying metallization pattern, such as to the metal vias V6 in the illustrated example. The MRAM cells 58 are arranged in a MRAM array having rows and columns of memory. The metallization patterns include access lines (e.g., word lines and bit lines) for the MRAM array. For example, the underlying metallization patterns (e.g., M1-M4) can include word lines disposed along the rows of the MRAM array and the overlying metallization patterns (e.g., M6) can include bit lines disposed along the columns of the MRAM array. Some of the devices 62 (e.g., access transistors), such as devices of the row decoder 54, are electrically coupled to the word lines of the MRAM array. The top electrodes 136 are electrically coupled to other devices, such as devices of the column decoder 56, by the bit lines of the MRAM array.

FIGS. 3 through 16B are various views of intermediate stages in the manufacturing of the semiconductor device 50, in accordance with some embodiments. Specifically, the manufacturing of the interconnect structure 68 (see FIG. 2) for the semiconductor device 50 is shown. As noted above, the interconnect structure 68 includes the MRAM cells 58 of the MRAM array 52 (see FIG. 1).

Figure 3:
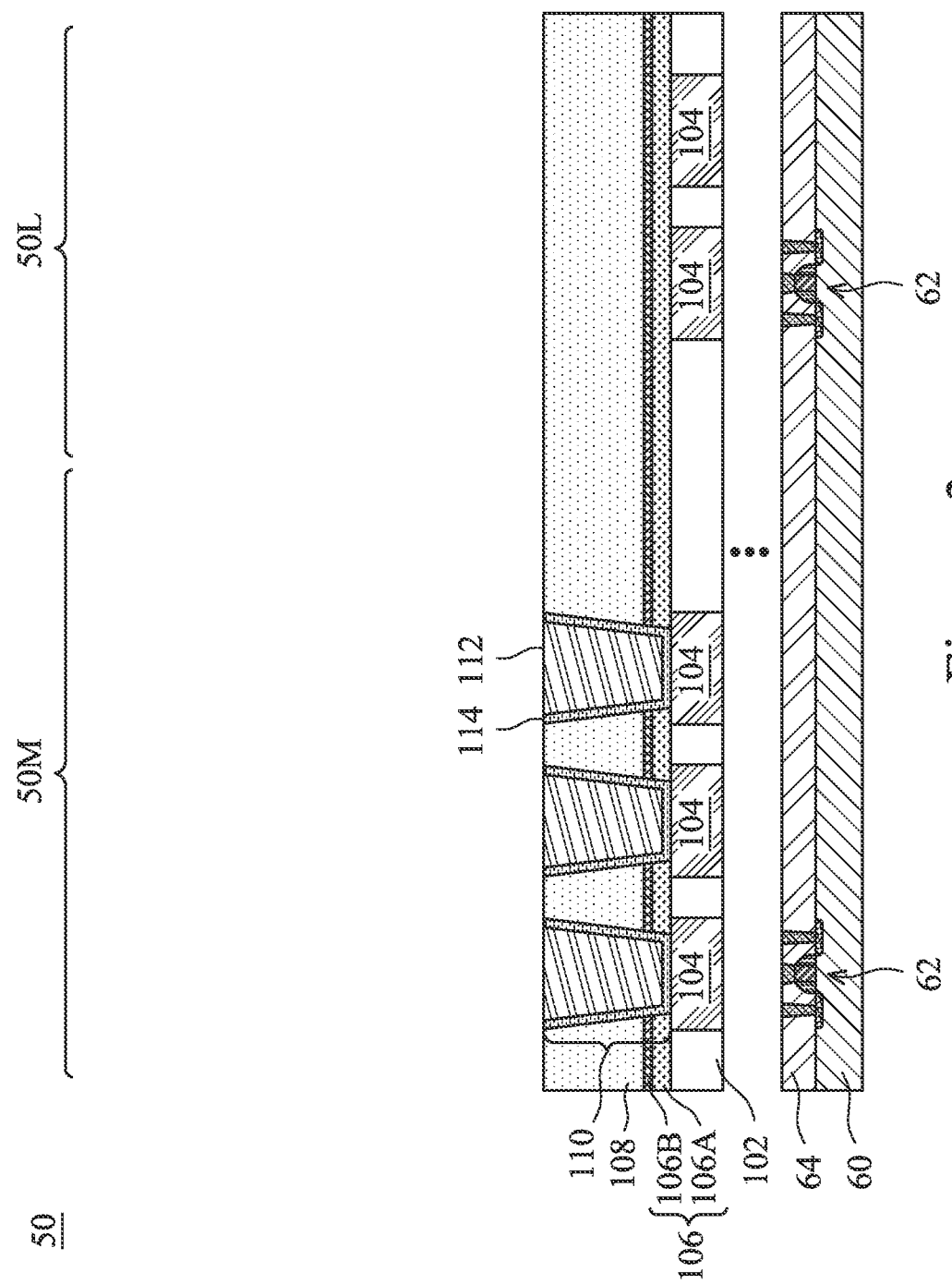

In FIG. 3, a metallization layer (e.g., M4, see FIG. 2) of the interconnect structure is formed. The metallization layer comprises an IMD layer 102 and conductive features 104 (which can correspond to the metal lines L4, see FIG. 2). The IMD layer 102 is formed over the ILD layer(s) 64. The IMD layer 102 may be formed of any suitable dielectric material, for example, an oxide such as silicon oxide, phosphosilicate glass (PSG), borosilicate glass (BSG), boron-doped phosphosilicate glass (BPSG), or the like; a nitride such as silicon nitride; combinations thereof; or the like. The IMD layer 102 may be formed by any acceptable deposition process, such as spin coating, physical vapor deposition (PVD), chemical vapor deposition (CVD), the like, or a combination thereof. The IMD layer 102 may be a layer formed of a low-k dielectric material having a k-value lower than about 3.0. The IMD layer 102 may be a layer formed of an extra-low-k (ELK) dielectric material having a k-value of less than 2.5.

Conductive features 104 are formed in the IMD layer 102, and are electrically connected to the devices 62. In accordance with some embodiments, the conductive features 104 include diffusion barrier layers and conductive material over the diffusion barrier layers. Openings are formed in the IMD layer 102 using, e.g., an etching process. The openings expose underlying conductive features, such as underlying metal vias. The diffusion barrier layers may be formed of tantalum nitride, tantalum, titanium nitride, titanium, cobalt-tungsten, or the like, and may be formed in the openings by a deposition process such as atomic layer deposition (ALD) or the like. The conductive material may include copper, aluminum, tungsten, silver, and combinations thereof, or the like, and may be formed over the diffusion barrier layers in the openings by an electro-chemical plating process, CVD, ALD, PVD, the like, or a combination thereof. In an embodiment, the conductive material is copper, and the diffusion barrier layers are thin barrier layers that prevent the copper from diffusing into the IMD layer 102. After formation of the diffusion barrier layers and the conductive material, excess of the diffusion barrier layers and conductive material may be removed by, for example, a planarization process such as a chemical mechanical polish (CMP) process. In some embodiments, the conductive features 104 are metal lines (which can correspond to the metal lines L4, see FIG. 2).

An etch stop layer 106 is formed on the conductive features 104 and IMD layer 102. The etch stop layer 106 may be formed of a dielectric material such as aluminum nitride, aluminum oxide, silicon oxide, silicon nitride, silicon oxynitride, silicon carbide, silicon carbonitride, silicon oxycarbonitride, silicon oxycarbide, a combination thereof, or the like. The etch stop layer 106 may be formed by chemical vapor deposition (CVD), physical vapor deposition (PVD), ALD, a spin-on-dielectric process, the like, or a combination thereof. The etch stop layer 106 may also be a composite layer formed of a plurality of dielectric sub-layers. For example, the etch stop layer 106 may include a silicidation blocking sub-layer 106A (such as a layer of silicon nitride, silicon carbide, silicon oxycarbide, silicon carbonitride, silicon oxycarbonitride, the like, or a combination thereof) and an aluminum oxide sub-layer 106B formed on the silicidation blocking sub-layer 106A, with the aluminum oxide sub-layer 106B having a thickness in a range of 10 Å to 40 Å, and the silicidation blocking sub-layer 106A having a thickness in a range of 10 Å to 150 Å. The silicidation blocking sub-layer 106A may reduce the formation of excess silicide during the subsequent formation of conductive contacts, which may be useful in reducing leakage current through a path provided by the excess silicide. The silicidation blocking sub-layer 106A may further act as an etch stop layer and be used as a glue layer to improve adhesion between the underlying layer and the aluminum oxide sub-layer 106B.

An IMD layer 108 is formed on the etch stop layer 106. In some embodiments, the IMD layer 108 is formed of a silicon oxide deposited using, e.g., a chemical vapor deposition (CVD) process with tetraethyl orthosilicate (TEOS) as a precursor. In some embodiments, the IMD layer 108 may be formed of PSG, BSG, BPSG, undoped silicate glass (USG), fluorosilicate glass (FSG), SiOCH, flowable oxide, a porous oxide, or the like, or combinations thereof. The IMD layer 108 may also be formed of a low-k dielectric material (e.g., a dielectric material having a k value lower than about 3.0), for example. The IMD layer 108 can be formed to a thickness in a range of 100 Å to 900 Å.

Conductive vias 110 are formed extending through the IMD layer 108 and etch stop layer 106. The conductive vias 110 can also be referred to as bottom vias. In some embodiments, the conductive vias 110 include conductive regions 112 and conductive barrier layers 114 lining sidewalls and bottom surfaces of the conductive regions 112. The conductive barrier layers 114 may be formed of titanium, titanium nitride, tantalum, tantalum nitride, cobalt, a combination thereof, or the like. The conductive regions 112 may be formed of metals such as copper, aluminum, tungsten, cobalt, alloys thereof, or the like. The formation of the conductive vias 110 may include etching the IMD layer 108 and etch stop layer 106 to form via openings, forming a blanket conductive barrier layer extending into the via openings, depositing a metallic material over the blanket conductive barrier layer, and performing a planarization process, such as a CMP process or a mechanical grinding process, to remove excess portions of the blanket conductive barrier layer and the metallic material.

Figure 4:
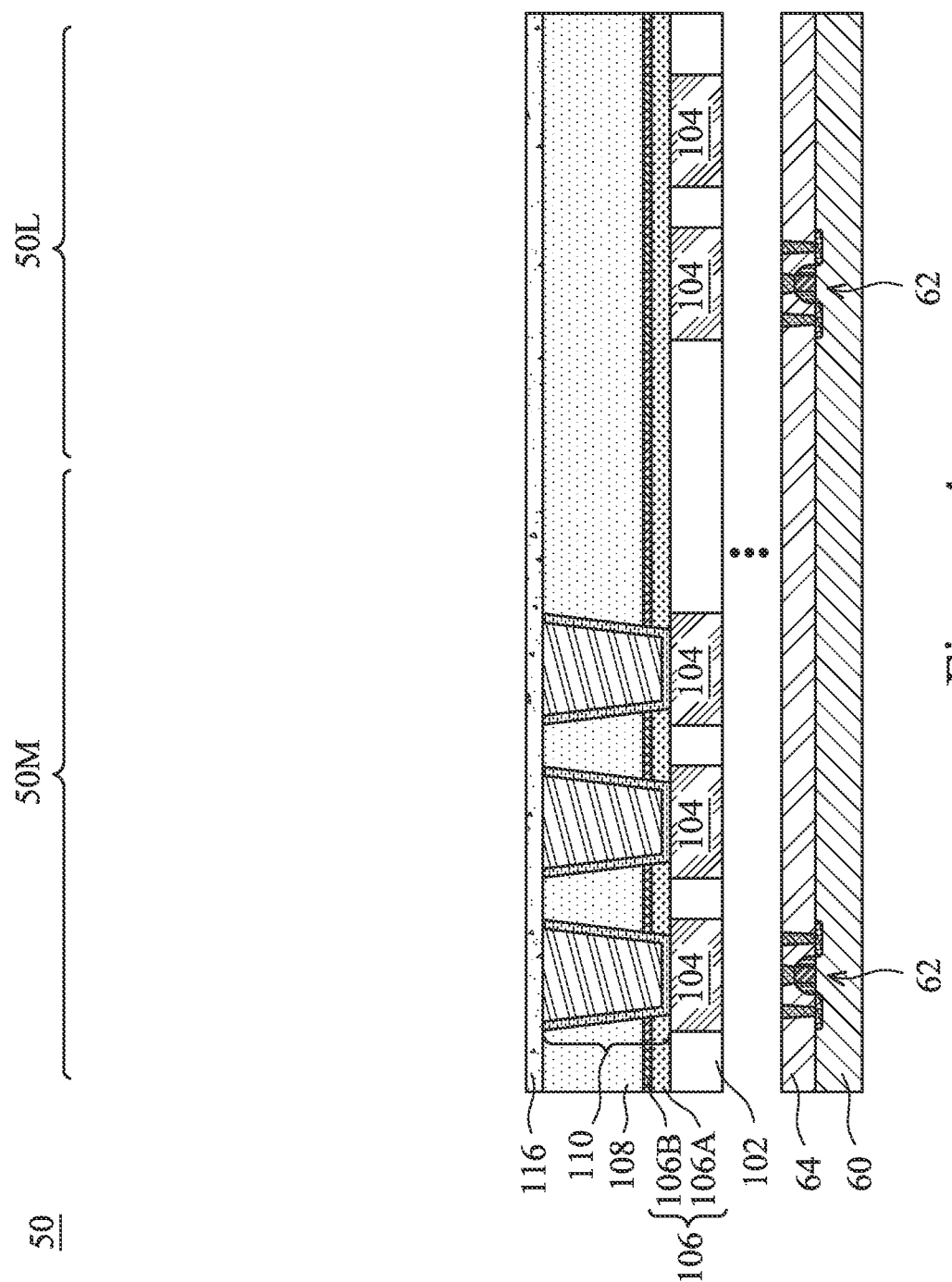

In FIG. 4, a bottom electrode layer 116 is formed on the conductive vias 110 and the IMD layer 108. The bottom electrode layer 116 is formed of a conductive material such as titanium (Ti), tantalum (Ta), aluminum (Al), tungsten (W), platinum (Pt), nickel (Ni), chromium (Cr), ruthenium (Ru), nitrides thereof, combinations thereof, multilayers thereof, or the like. The bottom electrode layer 116 is conformally formed, and may be formed using CVD, PVD, ALD, electro-chemical plating, electroless plating, or the like. In some embodiments, the bottom electrode layer 116 has a thickness in a range of 10 Å to 200 Å.

Figure 5:
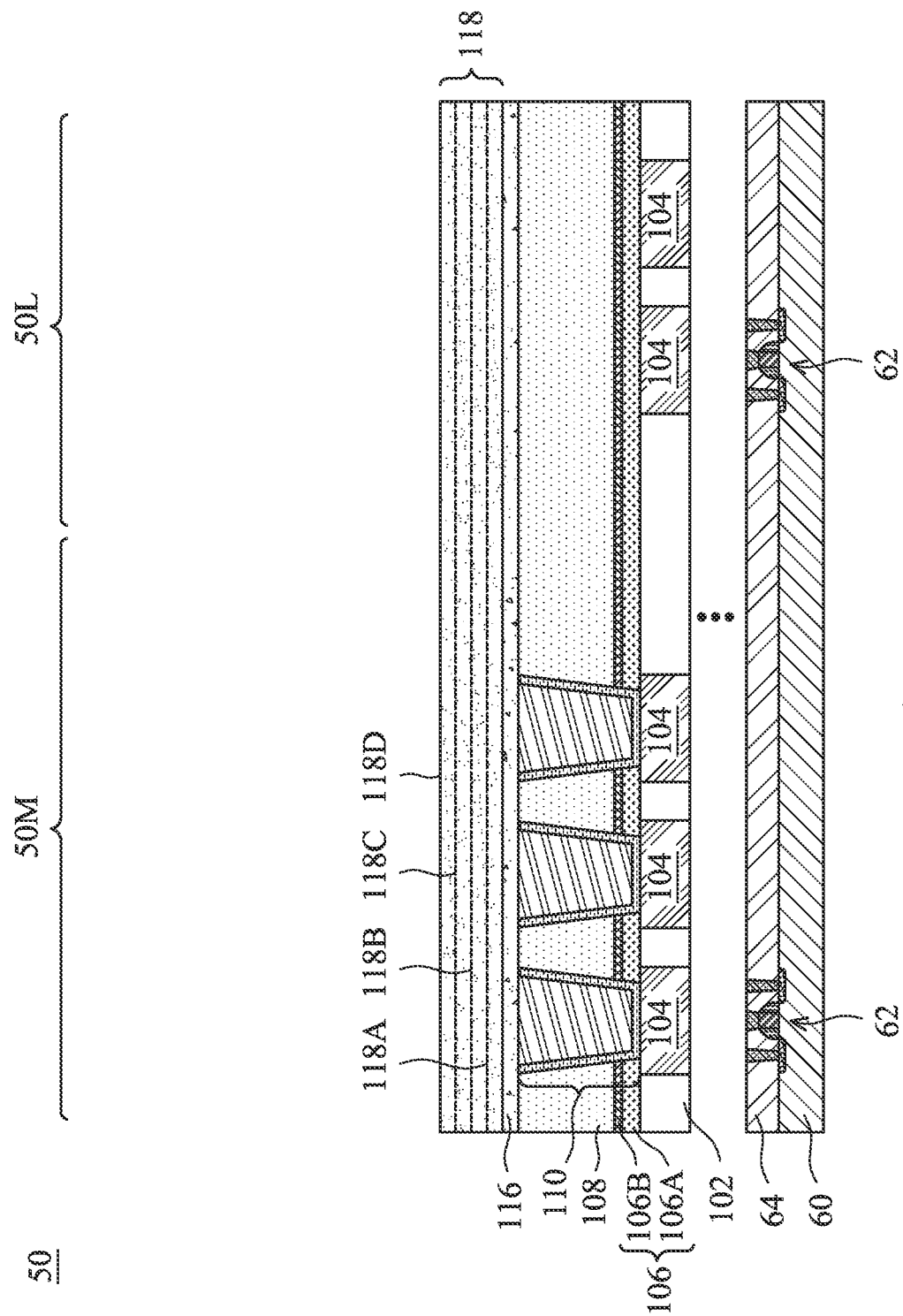

In FIG. 5, a MTJ film stack 118 is formed on the bottom electrode layer 116. The MTJ film stack 118 is a multilayer that includes an anti-ferromagnetic layer 118A, a pinned layer 118B over the anti-ferromagnetic layer 118A, a tunnel barrier layer 118C over the pinned layer 118B, and a free layer 118D over the tunnel barrier layer 118C. In some embodiments, the MTJ film stack 118 has an overall thickness in the range of 150 Å to 400 Å. Each layer of the MTJ film stack 118 may be deposited using one or more deposition methods such as, CVD, PVD, ALD, a combination thereof, or the like.

The anti-ferromagnetic layer 118A may be formed of a metal alloy including manganese (Mn) and one or more other metal(s) such as platinum (Pt), iridium (Ir), rhodium (Rh), nickel (Ni), palladium (Pd), iron (Fe), osmium (Os), or the like. For example, the anti-ferromagnetic layer 118A can be formed of PtMn, IrMn, RhMn, NiMn, PdPtMn, FeMn, OsMn, or the like. The anti-ferromagnetic layer 118A may have a thickness in the range of 25 Å to 100 Å.

The pinned layer 118B may be formed of a ferromagnetic material with a greater coercivity field than the free layer 118D, such as cobalt iron (CoFe), cobalt iron boron (CoFeB), a combination thereof, or the like. The pinned layer 118B may have a thickness in the range of 25 Å to 100 Å. In some embodiments, the pinned layer 118B has a synthetic ferromagnetic (SFM) structure, in which the coupling between magnetic layers is ferromagnetic coupling. The pinned layer 118B may also adopt a synthetic antiferromagnetic (SAF) structure including a plurality of magnetic metal layers separated by a plurality of non-magnetic spacer layers. The magnetic metal layers may be formed of cobalt, iron, nickel, or the like. The non-magnetic spacer layers may be formed of copper, ruthenium, iridium, platinum, tungsten, tantalum, magnesium, the like, or a combination thereof. For example, the pinned layer 118B may have a Co layer and repeated $(Pt/Co)_x$ layers over the Co layer, with x representing a repeating number that can be any integer equal to or greater than 1, such as an integer in the range of 3 to 20.

The tunnel barrier layer 118C may be formed of a dielectric material, such as magnesium oxide, aluminum oxide, aluminum nitride, a combination thereof, or the like. The tunnel barrier layer 118C may have a thickness in the range of 25 nm to 100 nm. The tunnel barrier layer 118C may be thicker than the other layers of the MTJ film stack 118.

The free layer 118D may be formed of a suitable ferromagnetic material such as cobalt-iron, nickel-iron, cobalt-iron-boron, cobalt-iron-boron-tungsten, .a combination thereof, or the like. The free layer 118D may have a synthetic antiferromagnetic (SAF) structure or a synthetic ferromagnetic structure. The magnetic moment of the free layer 118D is programmable, and the resistances of the resulting MTJ stacks are accordingly programmable. Specifically, the resistances of the resulting MTJ stacks can be changed between a high resistance ($R_{ap}$) and a low resistance ($R_p$) based on the programmed magnetic moment of the free layer 118D. As such, the resulting MTJ stacks can also be referred to as programmable resistance elements or programmable resistors. The thickness of the tunnel barrier layer 118C contributes to the $R_{ap}$ and the $R_p$ of the resulting MTJ stacks.

It should be appreciated that the materials and the structure of the MTJ film stack 118 may have many variations, which are also within the scope of the present disclosure. For example, the layers 118A, 118B, 118C, and 118D may be formed in an order inversed from that described above. Accordingly, the free layer 118D may be the bottom layer of the MTJ film stack 118, and the anti-ferromagnetic layer 118A may be the top layer of the MTJ film stack 118.

Figure 6:
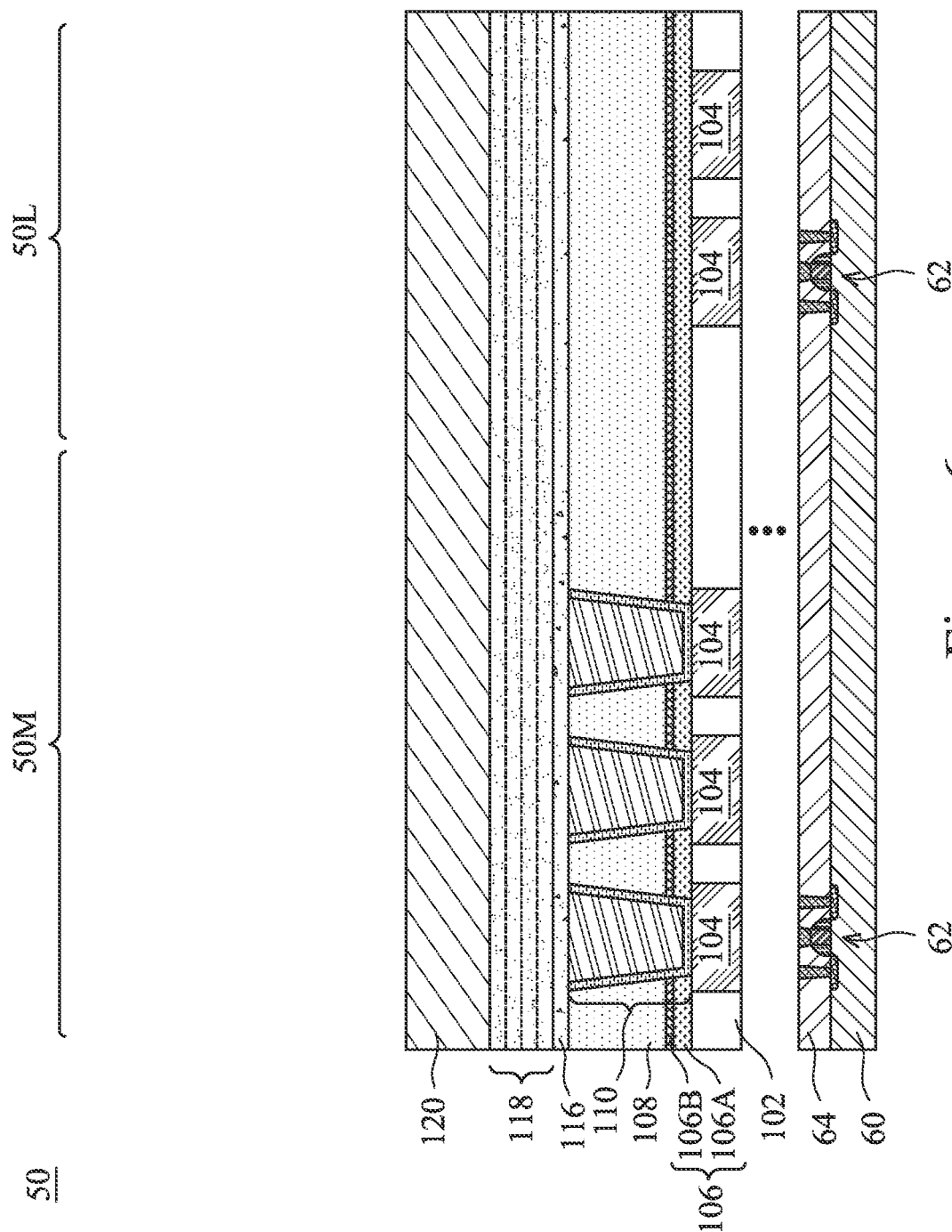

In FIG. 6, a top electrode layer 120 is formed on the MTJ film stack 118. In some embodiments, the top electrode layer 120 is formed as a blanket layer, and may be formed using CVD, PVD, ALD, electro-chemical plating, electroless plating, or the like. The top electrode layer 120 is a conductive layer, and may formed of a conductive material such as titanium (Ti), tantalum (Ta), aluminum (Al), tungsten (W), platinum (Pt), nickel (Ni), chromium (Cr), ruthenium (Ru), nitrides thereof, combinations thereof, multilayers thereof, or the like. In some embodiments, the top electrode layer 120 is formed of titanium nitride. In some embodiments, the top electrode layer 120 has a thickness in a range of 30 Å to 900 Å. In some embodiments, the thickness of the top electrode layer 120 is greater than the thickness of the bottom electrode layer 116. The top electrode layer 120 may be used as a hard mask in the subsequent patterning of the MTJ film stack 118.

Figure 7:
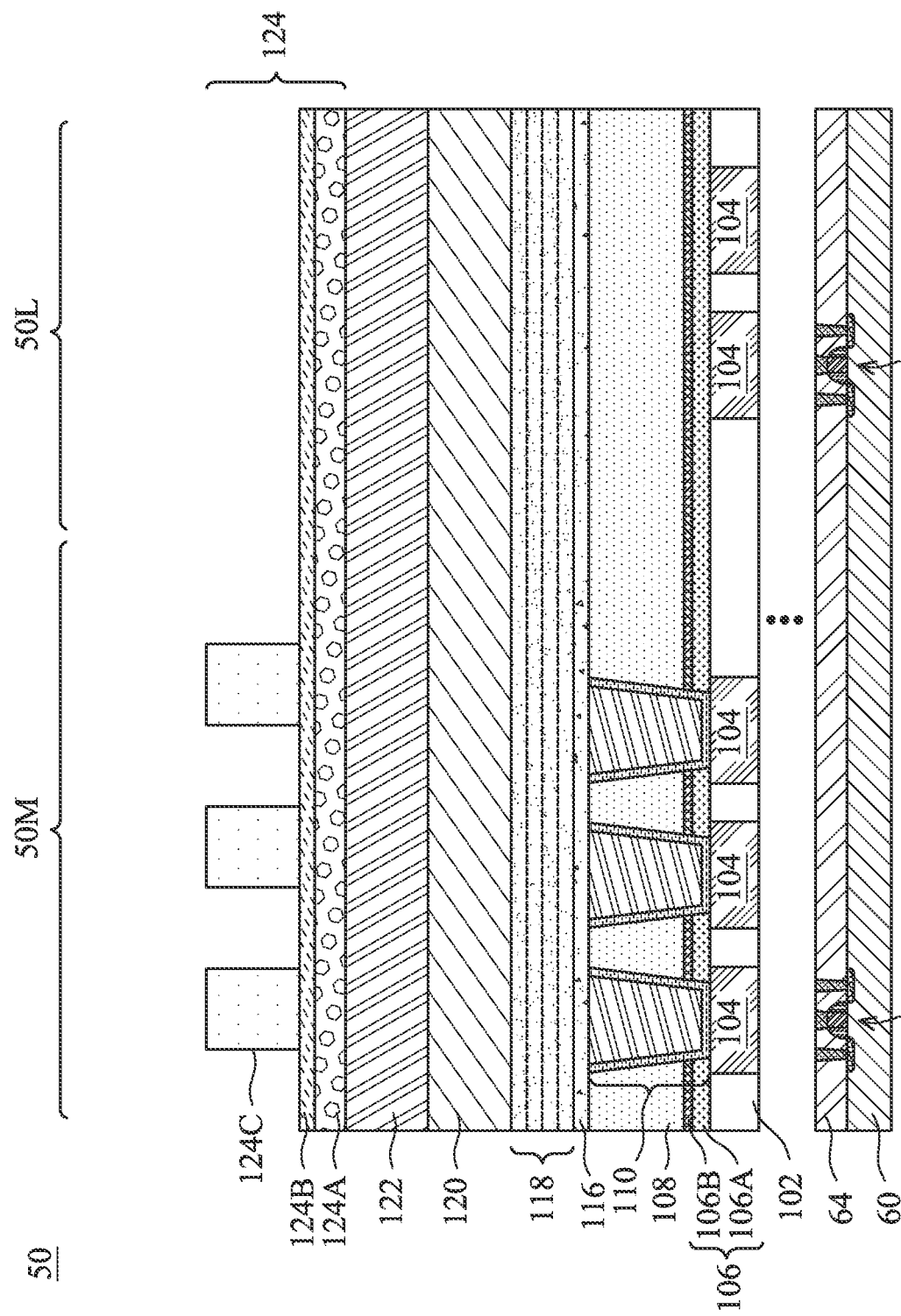

In FIG. 7, one or more masks are formed over the top electrode layer 120. The masks will be used to simultaneously pattern the various layers and form MRAM cells. In some embodiments, the one or more masks comprise one or more hard masks, photoresists, or the like. Any suitable mask layers with any suitable compositions may be used. For example, a hard mask layer 122 can be formed over the top electrode layer 120 and a photoresist 124 can be formed over the hard mask layer 122.

The hard mask layer 122 may be formed of an oxide such as titanium oxide, silicon oxide, a combination thereof, or the like, which may be formed by CVD, ALD, or the like. In some embodiments, the hard mask layer 122 is formed of silicon oxide using TEOS as a precursor. The hard mask layer 122 may have a thickness in a range of 100 Å to 1500 Å.

The photosensitive mask 124 may be any acceptable photoresist, such as a single-layer photoresist, a bi-layer photoresist, a tri-layer photoresist, or the like. In the illustrated embodiment, the photosensitive mask 124 is a tri-layer photoresist including a bottom layer 124A, a middle layer 124B, and a top layer 124C. In some embodiments, the bottom layer 124A is formed of amorphous carbon with a thickness in a range of 50 Å to 400 Å; the middle layer 124B is formed of amorphous silicon with a thickness in a range of 20 Å to 130 Å; and the top layer 124C is formed of a photosensitive material with a thickness in a range of 50 Å to 500 Å. The top layer 124C is patterned in the memory region 50M, with the pattern of the top layer 124C corresponding to the pattern of the subsequently formed MRAM cells.

Figure 8:
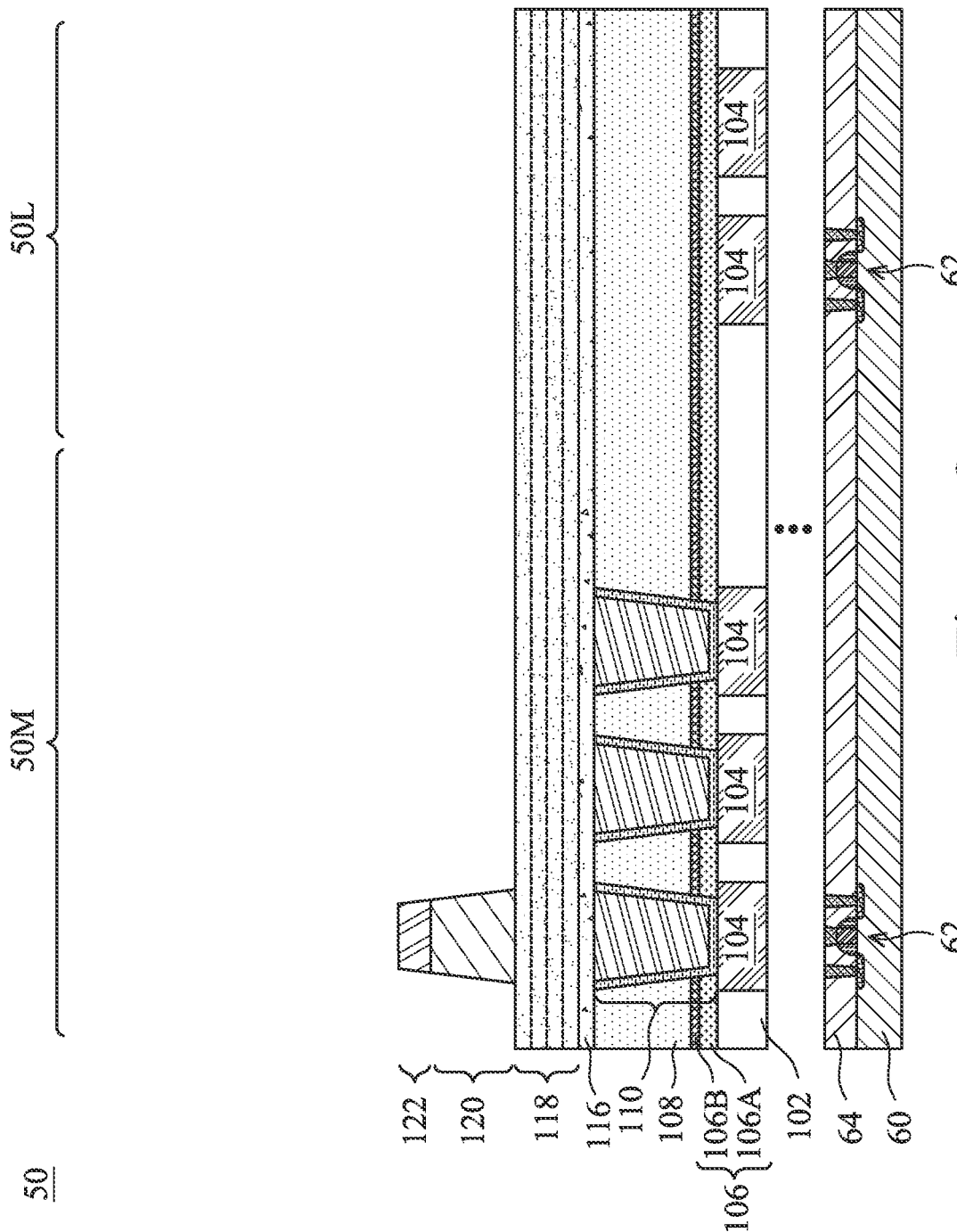

In FIG. 8, the photosensitive mask 124 is used as an etching mask to etch and pattern the hard mask layer 122, thus forming a patterned hard mask. The patterned hard mask is then used as an etching mask to etch and pattern the top electrode layer 120. The etching method may include a plasma etching method, such as ion beam etching (IBE). IBE offers a high level of precision (e.g., high anisotropism), which can help control the profile of the resulting MRAM cells. The etching may be implemented using glow discharge plasma (GDP), capacitive coupled plasma (CCP), inductively coupled plasma (ICP), or the like. One or more layers of the photosensitive mask 124 may be consumed in the etching process, or may be removed after the etching process.

After the etching process, remaining portions of the patterned hard mask layer 122 can have a reduced thickness, such as a thickness in a range of 20 Å to 220 Å. Alternatively, the thickness of the hard mask 122 may be substantially unchanged by the etching process. After the etching process, both the hard mask 122 and MTJ film stack 118 can be exposed.

Figure 9:
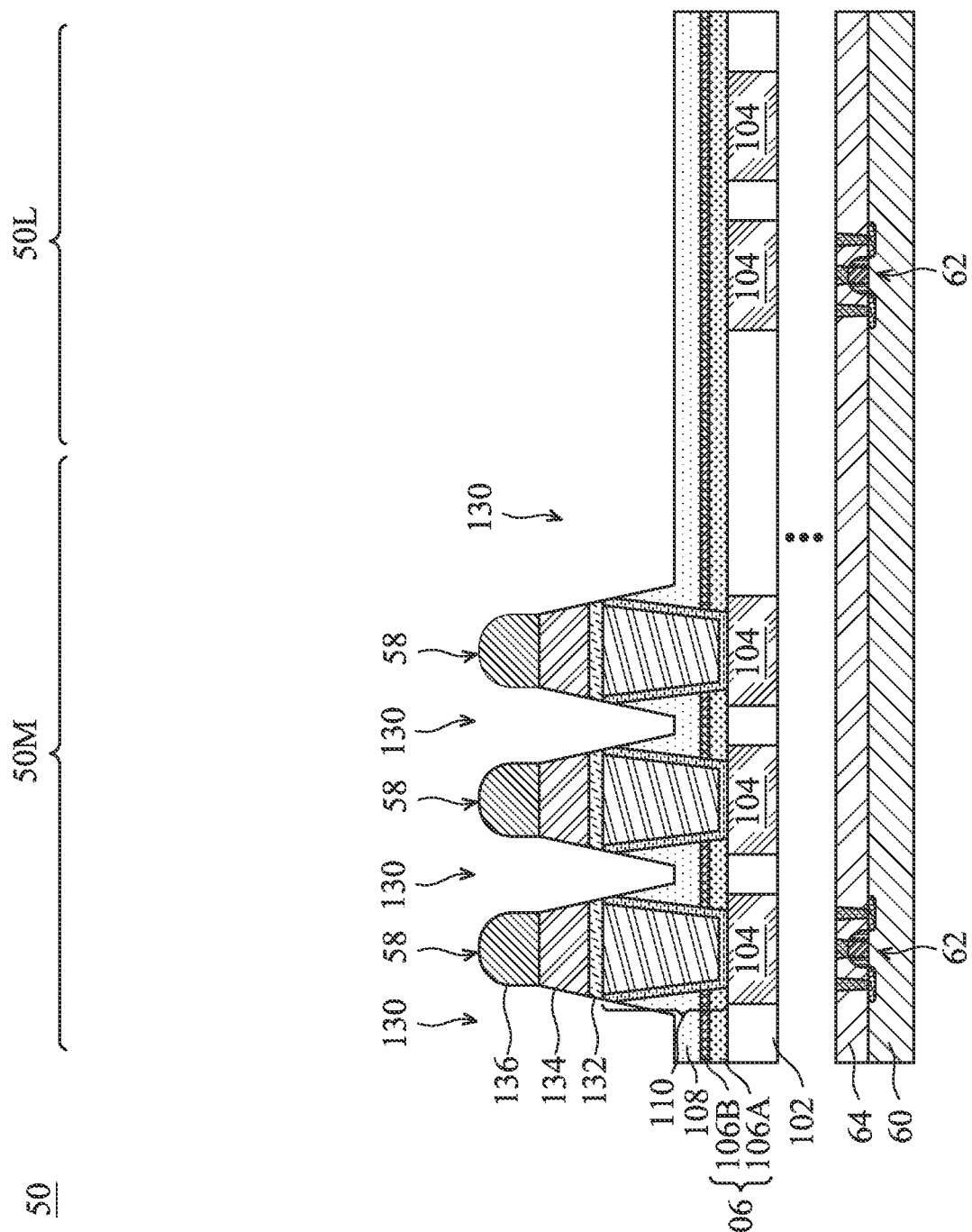

In FIG. 9, the patterned hard mask layer 122 and top electrode layer 120 are together used as an etching mask to etch and pattern the MTJ film stack 118 and bottom electrode layer 116. The patterning may include one or more etching processes and forms recesses 130 in the IMD layer 108. The etching method may include a plasma etching method, such as ion beam etching (IBE). The etching may be implemented using glow discharge plasma (GDP), capacitive coupled plasma (CCP), inductively coupled plasma (ICP), or the like. The patterned hard mask layer 122 may be consumed during the etching process, or may be removed after the etching process.

The etching process forms bottom electrodes 132, MTJ stacks 134, and top electrodes 136, which together form MRAM cells 58. Each MRAM cell 58 includes a bottom electrode 132, a MTJ stack 134, and a top electrode 136, with the MTJ stack 134 being disposed between the bottom electrode 132 and the top electrode 136. The bottom electrodes 132 comprise remaining portions of the bottom electrode layer 116. The MTJ stacks 134 comprise remaining portions of the MTJ film stack 118. The top electrodes 136 comprise remaining portions of the top electrode layer 120. In some embodiments, the etching process partially etches the IMD layer 108 and conductive vias 110. In such embodiments, the remaining portions of the IMD layer 108 have sloped sidewalls, and have trapezoidal shapes in the illustrated cross-section. The MTJ stacks 134 and bottom electrodes 132 also have sloped sidewalls, and have trapezoidal shapes in the illustrated cross-section. In some embodiments, the top electrodes 136 have domed top surfaces. In other embodiments, the top electrodes 136 have sloped sidewalls and flat top surfaces.

Figure 10A:
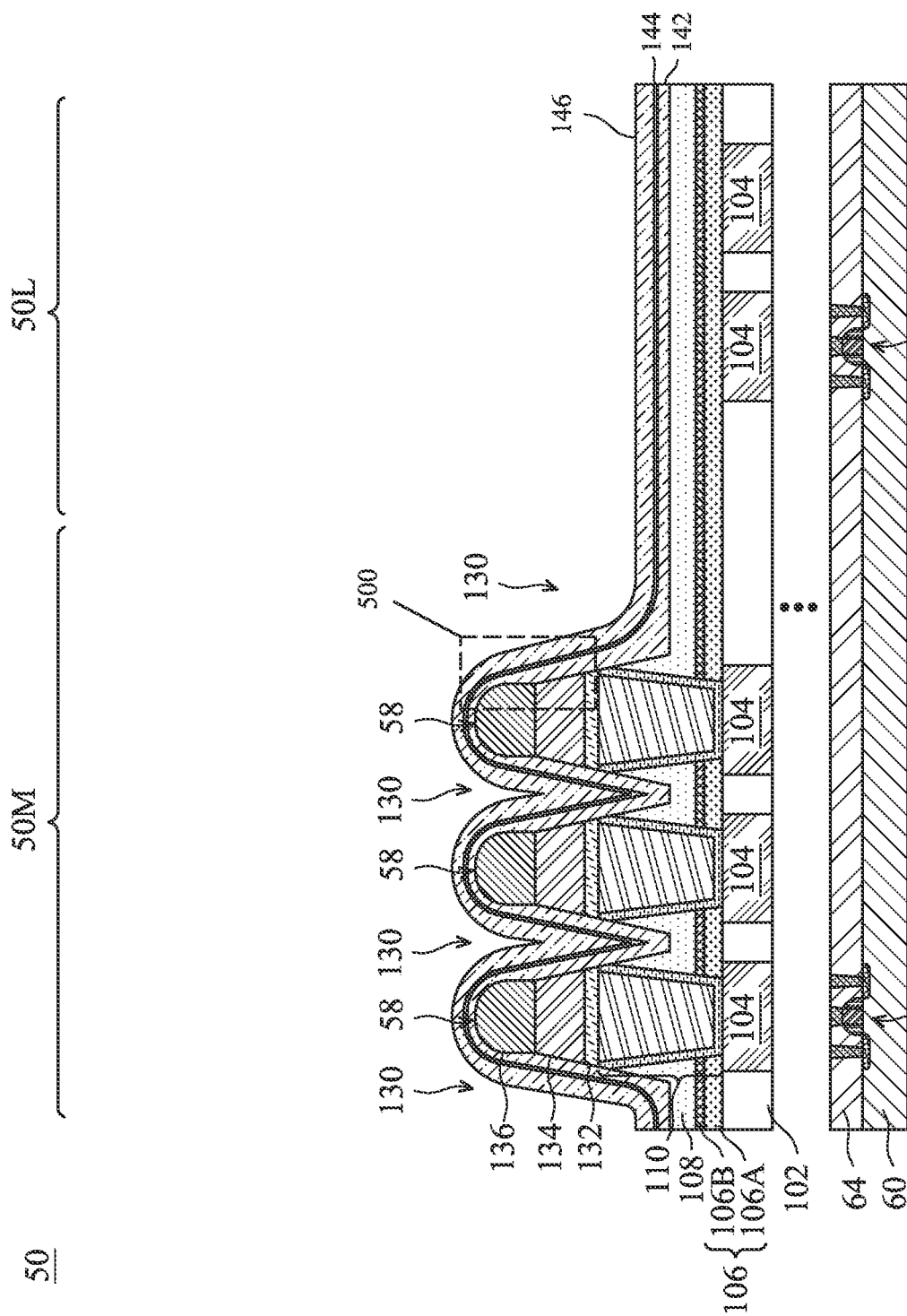

In FIGS. 10A and 10B, a first passivation layer 142, a second passivation layer 144, and a third passivation layer 146 are formed on the MRAM cells 58. FIG. 10B illustrates a detailed view of region 500 as illustrated in FIG. 10A. The first passivation layer 142, the second passivation layer 144, and the third passivation layer 146 will subsequently be patterned to form spacers that protect the MRAM cells 58. For example, the spacers help reduce moisture (e.g., $H_2O$) and hydrogen diffusion into the MTJ stacks 134 during subsequent processing.

The first passivation layer 142 is conformally formed over the MRAM cells 58 and in the recesses 130. The first passivation layer 142 is on (and contacts) the sidewalls of the bottom electrodes 132, the MTJ stacks 134, and the top electrodes 136. The first passivation layer 142 comprises a dielectric material, such as a nitride, such as silicon nitride, silicon oxynitride, silicon carbonitride, a combination thereof, or the like, and may be referred to as a nitride layer. The first passivation layer 142 may be formed using CVD, plasma-enhanced chemical vapor deposition (PECVD), ALD, plasma-enhanced atomic layer deposition (PEALD), PVD, a combination thereof, or the like. In some embodiments, the first passivation layer 142 is silicon nitride and is formed by PECVD using, e.g., SiH$_4$ and NH$_3$ as precursors. The first passivation layer 142 may be formed to a first thickness T$_1$ in a range of 10 Å to 50 Å, which may be advantageous for reducing moisture and hydrogen diffusion into the MTJ stacks 134 during subsequent processing without causing sidewall damage to the MTJ stacks 134. Forming the first passivation layer 142 to a first thickness T$_1$ of less than 10 Å may not sufficiently reduce moisture and hydrogen diffusion into the MTJ stacks 134. Forming the first passivation layer 142 to a first thickness T$_1$ of greater than 50 Å may lead to sidewall damage of the MTJ stacks 134, such as from CVD plasma during the formation of the first passivation layer 142.

A second passivation layer 144 is conformally formed over the first passivation layer 142, e.g., in the recesses 130. The second passivation layer 144 comprises a conductive material such as a metal, such as tantalum, magnesium, titanium, the like, or a combination thereof, and may be referred to as a metal layer. The second passivation layer 144 may be formed using a suitable method such as CVD, plasma-enhanced chemical vapor deposition (PECVD), ALD, plasma-enhanced atomic layer deposition (PEALD), PVD, the like, or a combination thereof. In some embodiments, the second passivation layer 144 is formed to a second thickness T$_2$ in a range of 5 Å to 20 Å, which may be advantageous for absorbing moisture and hydrogen to help protect the sidewalls of the MTJ stacks 134. Forming the second passivation layer 144 to a second thickness T$_2$ less than 5 Å may be disadvantageous by insufficiently absorbing moisture and hydrogen to protect the sidewalls of the MTJ stacks 134. Forming the second passivation layer 144 to a second thickness T$_2$ greater than 20 Å may be disadvantageous by leading to shorting of adjacent MRAM cells 58. The thickness T$_2$ is less than the thickness T$_1$.

A third passivation layer 146 is conformally formed over the second passivation layer 144. The third passivation layer 146 comprises a dielectric material, such as a nitride, such as silicon nitride, silicon oxynitride, silicon carbonitride, a combination thereof, or the like, and may be referred to as a nitride layer. The third passivation layer 146 may be formed using CVD, plasma-enhanced chemical vapor deposition (PECVD), ALD, plasma-enhanced atomic layer deposition (PEALD), PVD, a combination thereof, or the like. In some embodiments, the third passivation layer 146 is formed of the same dielectric material as the first passivation layer 142 (e.g., silicon nitride). In some embodiments, the deposition process for forming the third passivation layer 146 is a different type of deposition process than the deposition process for forming the first passivation layer 142. In some embodiments, the third passivation layer 146 is deposited with a deposition process that uses plasma, such as PECVD or PEALD. Using plasma when depositing the third passivation layer 146 allows deposition to be performed at a low temperature, thereby helping reduce damage to the devices. The third passivation layer 146 may be formed using PECVD with, e.g., SiH4 and NH3 as precursors. The PECVD process may be performed using a plasma power measured at the power supply in a range of 100 W to 800 W, at a temperature in a range of 120° C. to 300° C., at a pressure in a range of 0.1 Torr to 100 Torr, and for a duration in a range of 5 s to 100 s. The third passivation layer 146 may be formed to a third thickness T3 in a range of 50 Å to 500 Å, which may be advantageous for absorbing moisture and hydrogen to help protect the sidewalls of the MTJ stacks 134. The thickness T2 is less than the thickness T3.

The first passivation layer 142, the second passivation layer 144, and the third passivation layer 146 absorb moisture and hydrogen to help protect the sidewalls of the MTJ stacks 134 during subsequent processing. The first passivation layer 142 and the third passivation layer 146 may both be formed of nitrides, which provide separation to avoid shorting of adjacent MRAM cells 58. A plasma-enhanced deposition process (e.g., PECVD) is used to deposit the third passivation layer 146 at a low temperature and to a sufficient thickness (previously described). The second passivation layer 144 is formed of a conductive material, which is more effective at absorbing moisture and hydrogen than the nitride of the first passivation layer 142 and the third passivation layer 146. Including the second passivation layer 144 between the first passivation layer 142 and the third passivation layer 146 allows the third passivation layer 146 to be deposited to a smaller thickness while still providing enough separation to avoid shorting of adjacent MRAM cells 58. Sidewall damage to the MTJ stacks 134 from CVD plasma may thus be reduced.

Figure 11A:
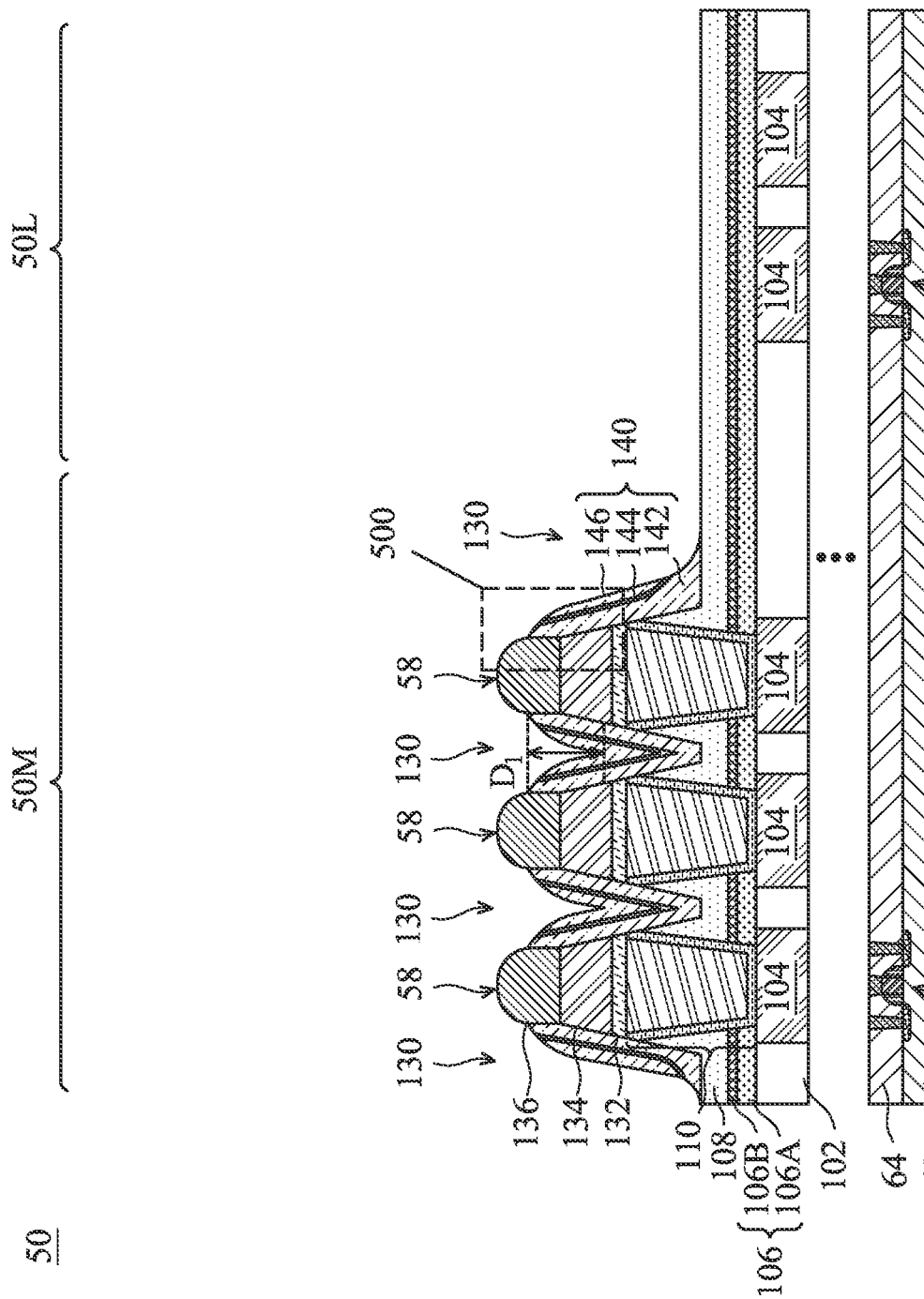
Figure 11B:
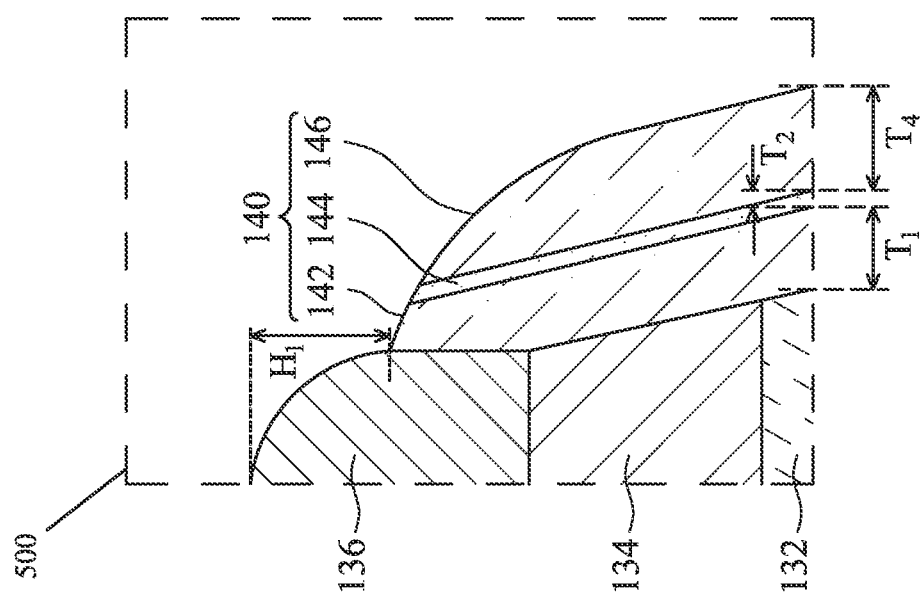

In FIGS. 11A and 11B, the first passivation layer 142, the second passivation layer 144, and the third passivation layer 146 are patterned to form spacers 140. FIG. 11B illustrates a detailed view of region 500 as illustrated in FIG. 11A. The patterning of the spacers 140 exposes top surfaces of the MRAM cells 58 to allow subsequent connection of the top electrodes 136 to subsequently formed conductive features (see below, FIG. 16A). The patterning removes horizontal portions of the first passivation layer 142, the second passivation layer 144, and the third passivation layer 146. The remaining portions of the first passivation layer 142, the second passivation layer 144, and the third passivation layer 146 form the spacers 140. The IMD layer 108 in the logic region 50L is exposed after the spacers 140 are patterned.

After the patterning, the top electrodes 136 may be exposed to a first height H$_1$ below the top surface of the top electrodes 136 in a range of 30 Å to 500 Å, which may be advantageous for allowing subsequent electrical connection to the top electrodes 136 while protecting the sidewalls of the MTJ stacks 134 from moisture and hydrogen. Exposing the top electrodes to a first height H$_1$ less than 30 Å may be disadvantageous for not allowing subsequent electrical connection to the top electrodes 136, leading to poorer device performance. Exposing the top electrodes to a first height H$_1$ greater than 500 Å may be disadvantageous for insufficiently protecting the sidewalls of the MTJ stacks 134 from moisture and hydrogen.

After the patterning, the third passivation layer 146 may have a fourth thickness T$_4$ in a range of 30 Å to 250 Å, which may be advantageous for reducing moisture and hydrogen diffusion into the MTJ stacks 134 during subsequent processing without causing sidewall damage to the MTJ stacks 134 during etching of the third passivation layer 146. Patterning the third passivation layer 146 to a fourth thickness T$_4$ less than 30 Å may be disadvantageous by insufficiently reducing moisture and hydrogen diffusion into the MTJ stacks 134. Patterning the third passivation layer 146 to a fourth thickness T$_4$ greater than 250 Å may be disadvantageous by exceeding the spacing between adjacent MRAM cells 58. The thickness T$_2$ is less than the thickness T$_4$.

The recesses 130 between the MRAM cells 58 may have a first depth D$_1$, measured between a top surface of the spacers 140 and a bottom point of the recesses 130, in a range of 30 Å to 300 Å after the patterning of the spacers 140. In some embodiments (not separately illustrated), the recesses 130 expose sidewalls of the second passivation layer 144. In some embodiments (not separately illustrated), the recesses 130 expose top surfaces of the IMD layer 108 between the MRAM cells 58.

Figure 12:
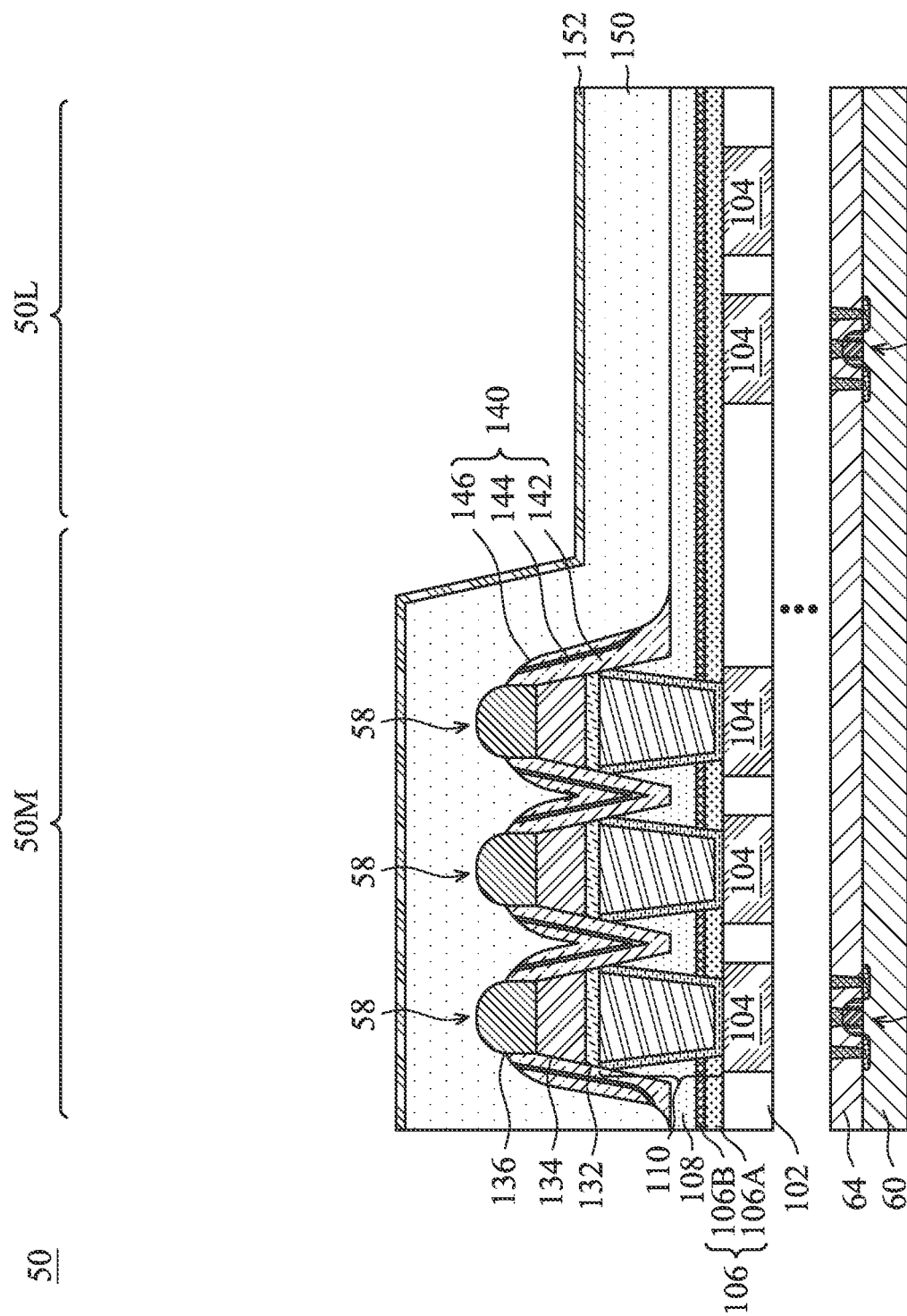

In FIG. 12, an IMD layer 150 is formed over the spacers 140, MRAM cells 58, and IMD layer 108. The spacers 140 may protect sidewalls of the MRAM cells 58 from moisture and hydrogen diffusion during the formation of the IMD layer 150. The IMD layer 150 is disposed on and around the spacers 140, and is disposed on and around the top electrodes 136. In some embodiments, the IMD layer 150 is formed using similar materials and methods as the IMD layer 108. An anti-reflective layer 152 is then formed on the IMD layer 150. The anti-reflective layer 152 may be a nitrogen-free anti-reflective layer (NFARL), and may be formed of a nitrogen-free dielectric material such as silicon oxycarbide. The IMD layer 150 and anti-reflective layer 152 will be used to protect the memory region 50M during subsequent processing of the logic region 50L.

Figure 13:
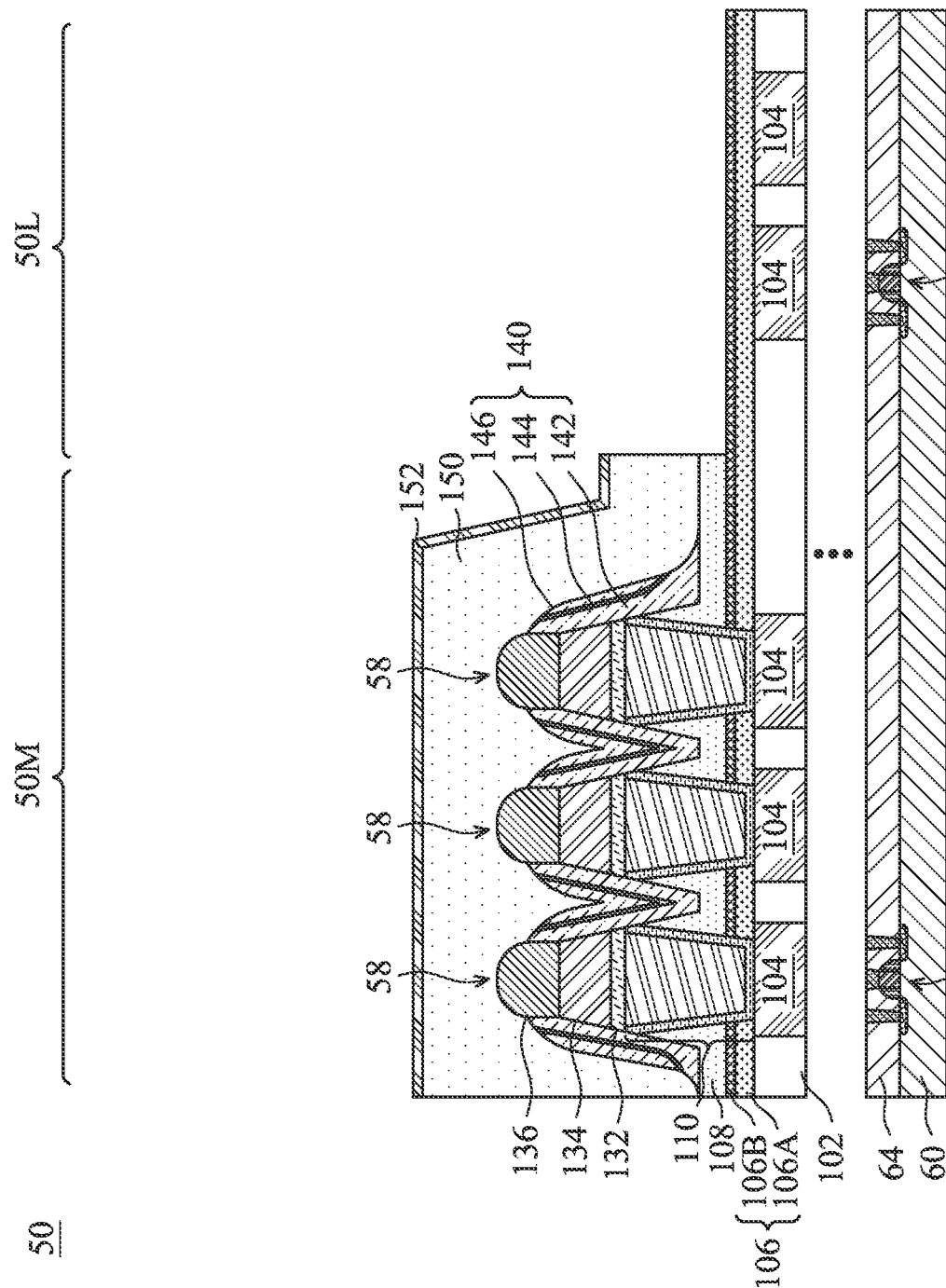

In FIG. 13, the anti-reflective layer 152, IMD layer 150, and IMD layer 108 are patterned to expose the etch stop layer 106 in the logic region 50L. In some embodiments, the patterning process may comprise suitable photolithography and etching processes. Portions of the anti-reflective layer 152 and IMD layer 150 in the memory region 50M remain after the patterning process.

Figure 14:
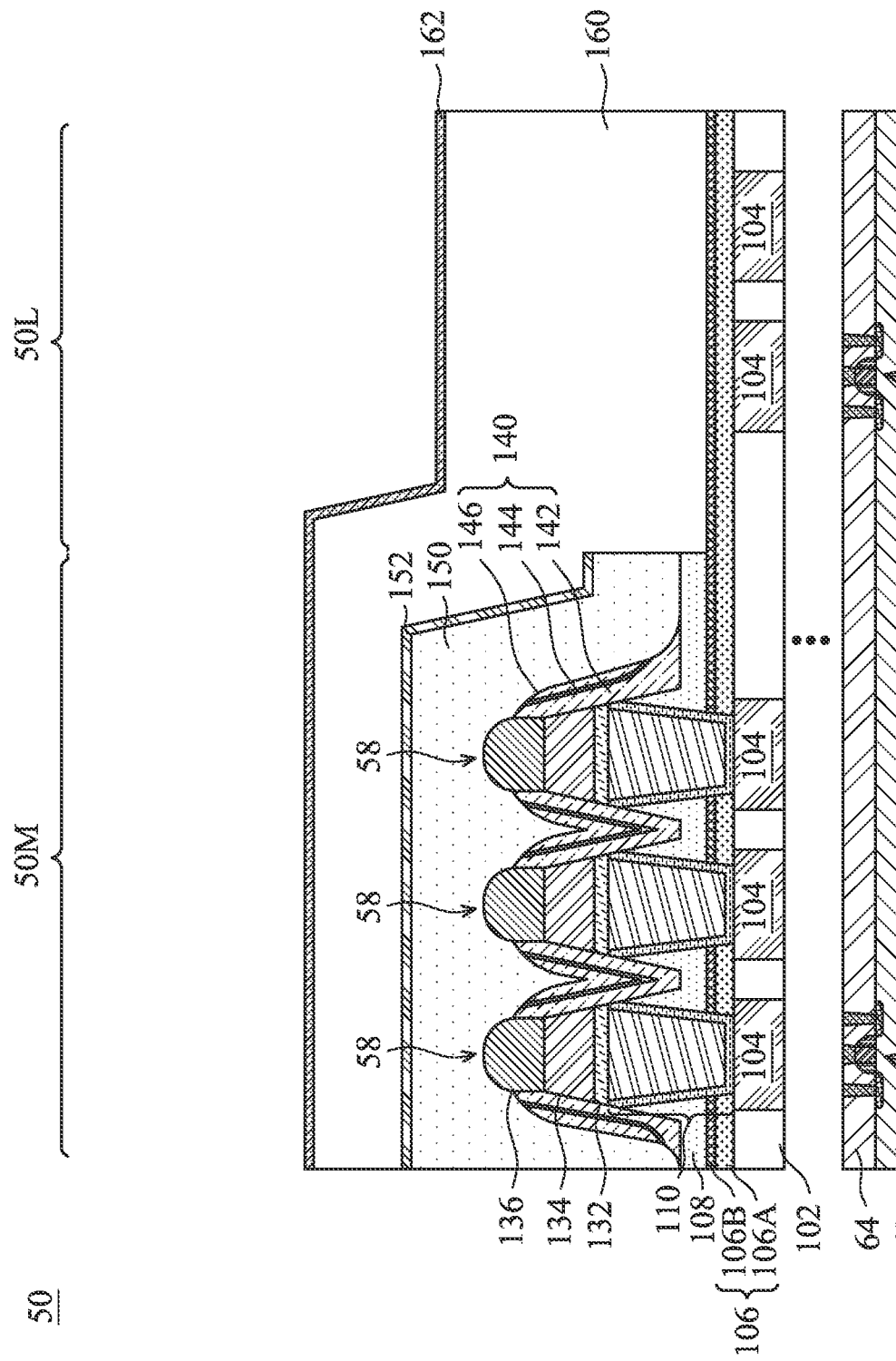

In FIG. 14, an IMD layer 160 is formed over the etch stop layer 106 and the remaining portions of the anti-reflective layer 152, the IMD layer 150, and the IMD layer 108. The IMD layer 160 is adjacent the IMD layers 108, 150. In some embodiments, the IMD layer 160 is formed of similar materials and by similar methods as the IMD layer 108. An anti-reflective layer 162 is then formed on the IMD layer 160. In some embodiments, the anti-reflective layer 162 is formed of similar materials and by similar methods as the anti-reflective layer 152.

Figure 15:
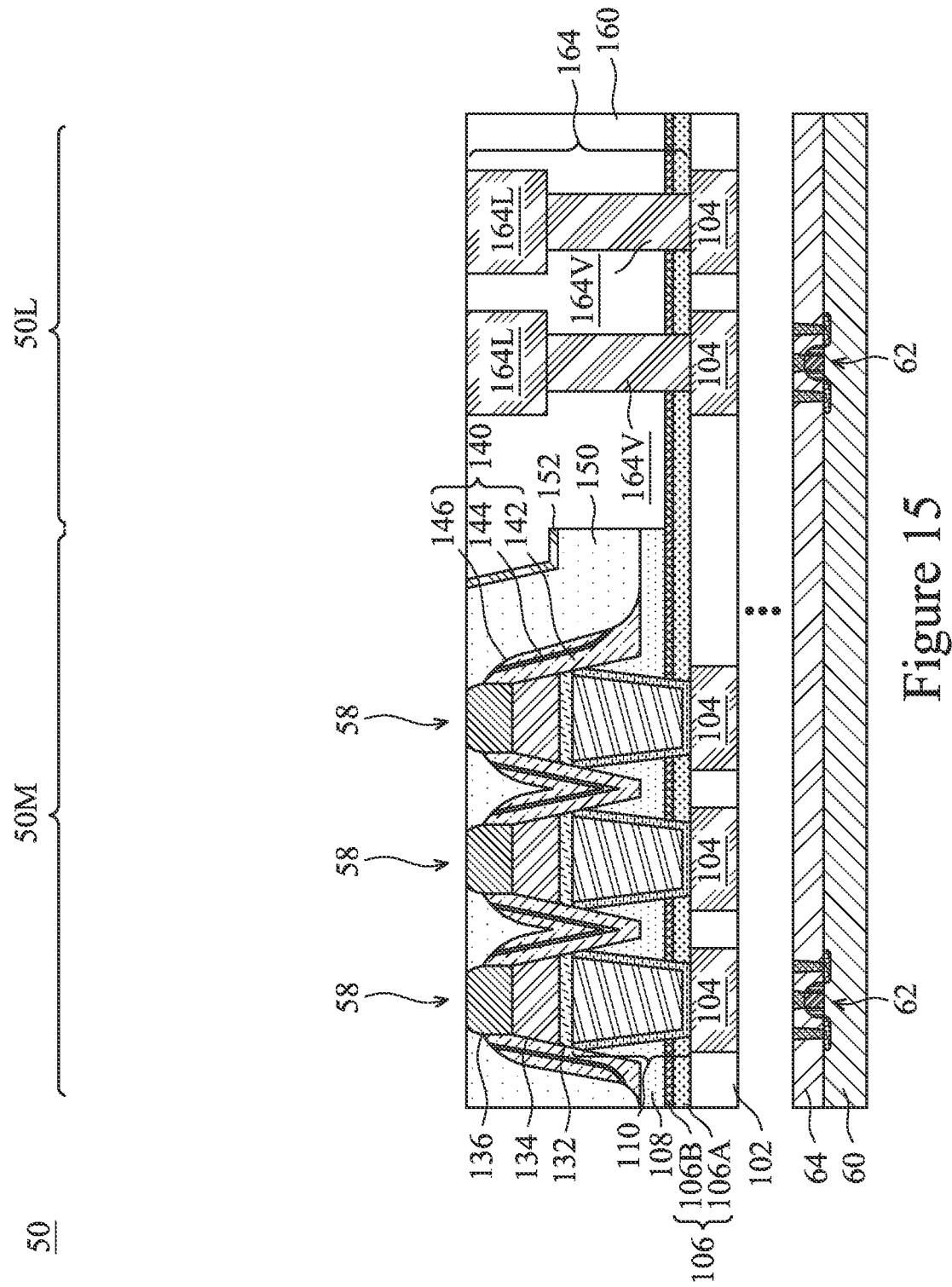

In FIG. 15, conductive features 164 are formed in the IMD layer 160 and etch stop layer 106. The conductive features 164 may include conductive lines 164L and conductive vias 164V, and are formed in the logic region 50L. The memory region 50M may be free from the conductive features 164. The conductive features 164 may be formed by suitable methods, such as a damascene process. Example damascene processes include single damascene processes, dual damascene processes, and the like. In some embodiments, openings for the conductive features 164 are formed by a via-first process. In other embodiments, openings for the conductive features 164 are formed by a trench-first process. The openings may be formed using suitable photolithography and etching techniques. Subsequently, the openings are filled with suitable conductive materials, such as copper, aluminum, combinations thereof, or the like. Next, a planarization process, such a CMP process, is performed to remove excess materials over the memory region 50M and expose the top electrodes 136. In some embodiments, the top surfaces of the top electrodes 136 are coplanar (within process variations) with the top surfaces of the conductive features 164 after planarization. In some embodiments, the planarization process completely removes the anti-reflective layer 162 (see FIG. 14). Although each conductive via 164V and corresponding conductive line 164L is illustrated as a separate element, it should be appreciated that they may be a continuous conductive feature, such as in embodiments where they are formed by a dual damascene process.

Figure 16A:
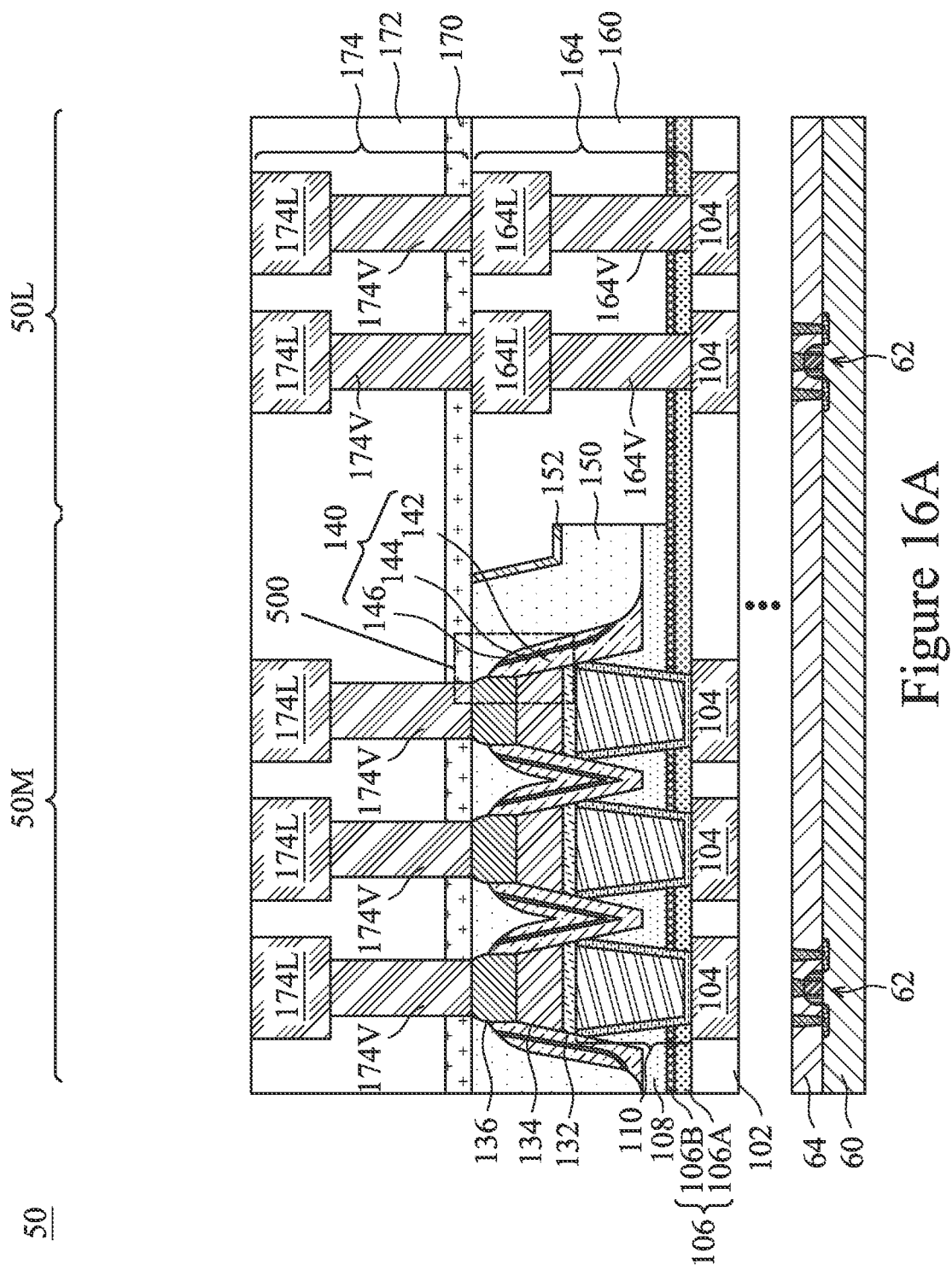

In FIGS. 16A and 16B, another metallization layer of the interconnect structure (e.g., M6, see FIG. 2) is formed. FIG. 16B illustrates a detailed view of region 500 as illustrated in FIG. 16A. The metallization layer comprises an etch stop layer 170, an IMD layer 172, and conductive features 174. The conductive features 174 include conductive vias 174V (which can correspond to the metal vias V6, see FIG. 2) and conductive lines 174L (which can correspond to the metal lines L6, see FIG. 2). The conductive features 174 are formed in both the logic region 50L and memory region 50M. In some embodiments, the etch stop layer 170 is formed of similar materials and by similar methods as the etch stop layer 106. In some embodiments, the IMD layer 172 is formed of similar materials and by similar methods as the IMD layer 160. In some embodiments, the conductive features 174 are formed of similar materials and by similar methods as the conductive features 164. The conductive features 174 are electrically coupled to the memory devices (e.g., MRAMs) formed in the memory region 50M and the logic devices (e.g., logic circuits) formed in the logic region 50L. Specifically, the conductive features 174 are physically and electrically coupled to the conductive features 164 and the top electrodes 136. In some embodiments, the conductive features 174 electrically couple the memory devices to the logic devices. For example, the conductive features 174 can be used to electrically couple some of the conductive features 164 to some of the top electrodes 136, such as in the illustrated metallization layer, or in another metallization layer. Although each conductive via 174V and corresponding conductive line 174L is illustrated as a separate element, it should be appreciated that they may be a continuous conductive feature, such as in embodiments where they are formed by a dual damascene process.

FIG. 16B illustrates the spacers 140 after planarization. The spacers 140 are separated from the features of the overlying metallization layer (e.g., the etch stop layer 170 and the conductive features 174) by portions of the IMD layer 150. In some embodiments, the spacers 140 are disposed a second height H2 below the top surface of the top electrodes 136 in a range of 30 Å to 300 Å, which may be advantageous for allowing electrical connection to the top electrodes 136 with the conductive vias 174V while protecting the sidewalls of the MTJ stacks 134 from moisture and hydrogen during etching. The IMD layer 150 may cover portions of sidewalls of the top electrodes 136 above the spacers 140.

FIGS. 17A through 23B are cross-sectional views of intermediate stages in the manufacturing of a semiconductor device 250. In this embodiment, the semiconductor device 250 is similar to the semiconductor device 50 described above in reference to FIGS. 3 through 16B, where like reference numerals indicate like elements formed using like processes. Embodiments of the semiconductor device 250 and the manufacturing thereof may differ from embodiments of the semiconductor device 50 and the manufacturing thereof by, e.g., a passivation layer 242 formed over the MRAM cells 58 comprising amorphous carbon. Some of the processing steps of the embodiment of FIGS. 17A through 23B are similar to the processing steps of the embodiment of FIGS. 3 through 16B, and so only differences in the processing steps are described.

Figure 17A:
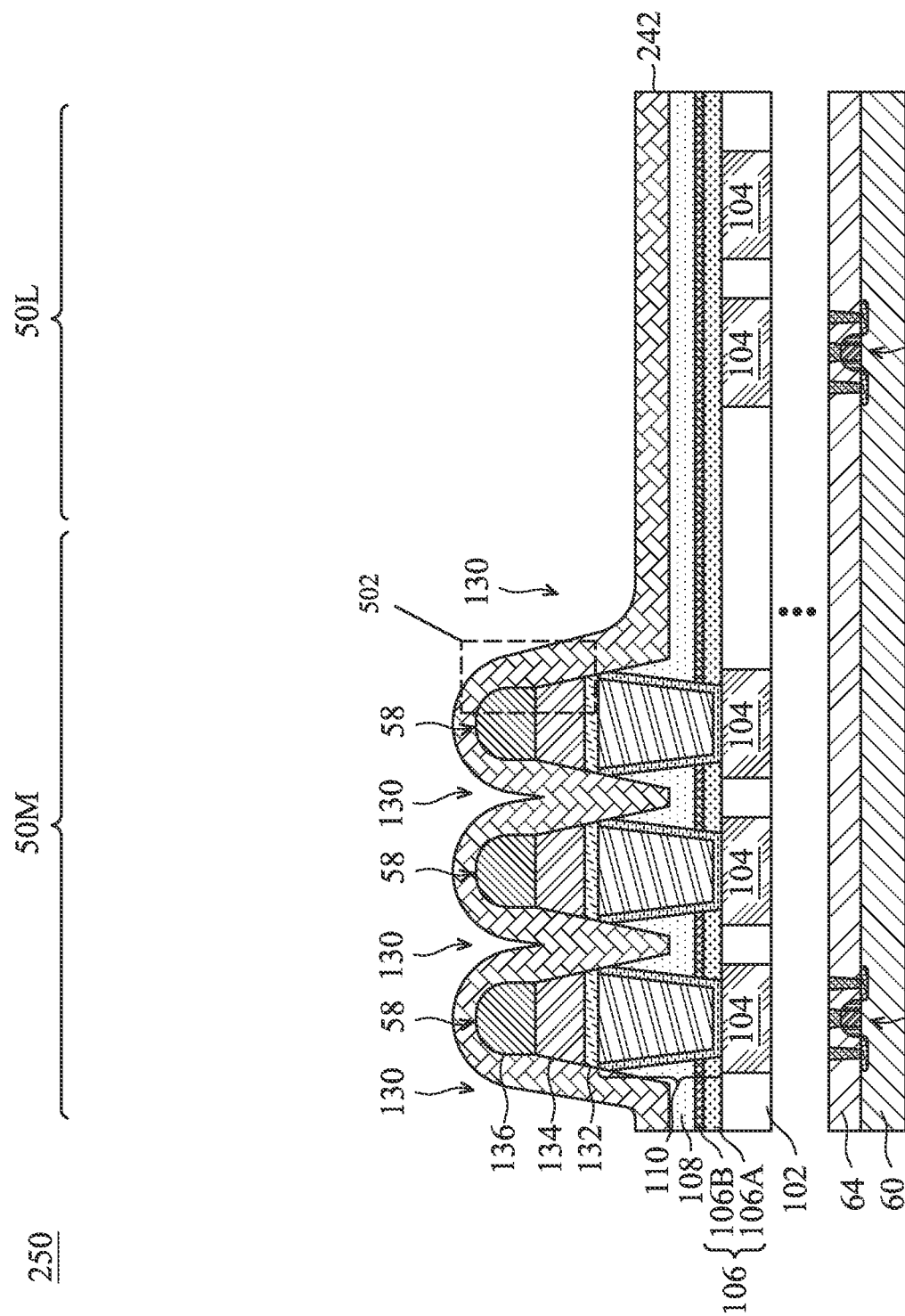
FIGS. 17A, 17B, 18A, 18B, 19, 20, 21, 22, 23A, and 23B are cross-sectional views of intermediate stages in the manufacturing of a semiconductor device, in accordance with some embodiments.
Figure 17B:
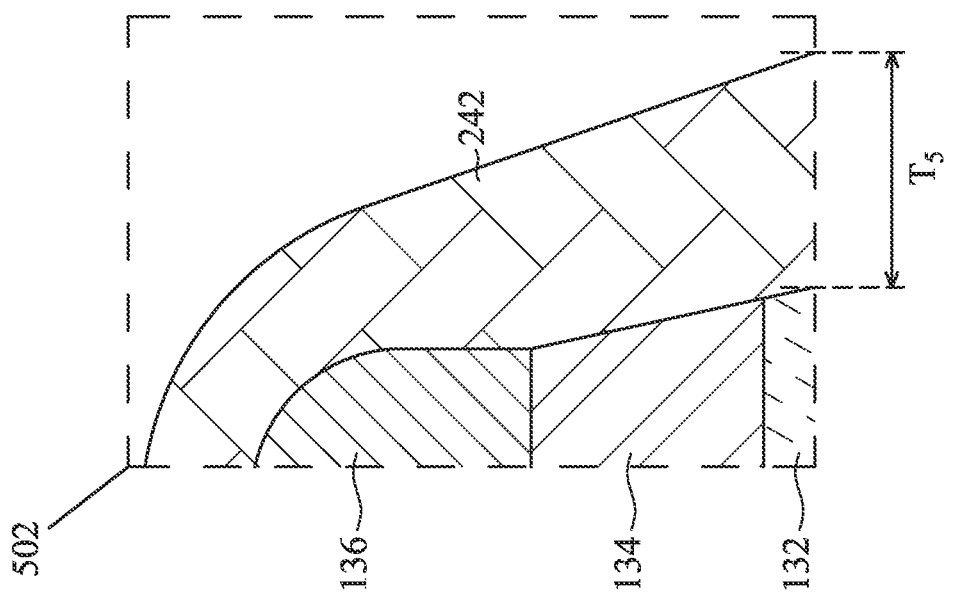

FIGS. 17A and 17B shows the semiconductor device 250 at a similar state of processing as FIG. 8, e.g., after patterning the MRAM cells 58. FIG. 17B illustrates a detailed view of region 502 as illustrated in FIG. 17A. As illustrated in FIGS. 17A and 17B, a passivation layer 242 comprising carbon is formed on the MRAM cells 58 in lieu of the first passivation layer 142, the second passivation layer 144, and the third passivation layer 146. The passivation layer 242 can be conformally formed over the MRAM cells 58 and in the recesses 130. The passivation layer 242 may be formed using plasma-enhanced chemical vapor deposition (PECVD). However, any suitable process may be used to form the passivation layer 242. In some embodiments, the passivation layer 242 is amorphous carbon and is formed using PECVD with, e.g., $SiH_4$ and/or $Si_2H_6$ as a precursor. Specifically, the passivation layer 242 is a single continuous layer of amorphous carbon. The PECVD process may be performed using a plasma power measured at the power supply in a range of 50 W to 1000 W, at a temperature in a range of 150° C. to 400° C., and at a pressure in a range of 0.1 Torr to 10 Torr. The passivation layer 242 may be formed to a fifth thickness $T_5$ in a range of 100 Å to 1000 Å. Using plasma when depositing the passivation layer 242 allows deposition to be performed at a low temperature, thereby helping reduce damage to the devices.

PECVD with carbon produces less bombardment damage than PECVD with nitrides. By forming the passivation layer 242 with carbon, bombardment damage to the sidewalls of the MTJ stacks 134 from the deposition process of the passivation layer 242 may be reduced. Further, carbon has a greater density than nitrides. The density of the passivation layer 242 may be increased by using carbon, which may reduce moisture and hydrogen diffusion into the MTJ stacks 134 during subsequent processing.

Figure 18A:
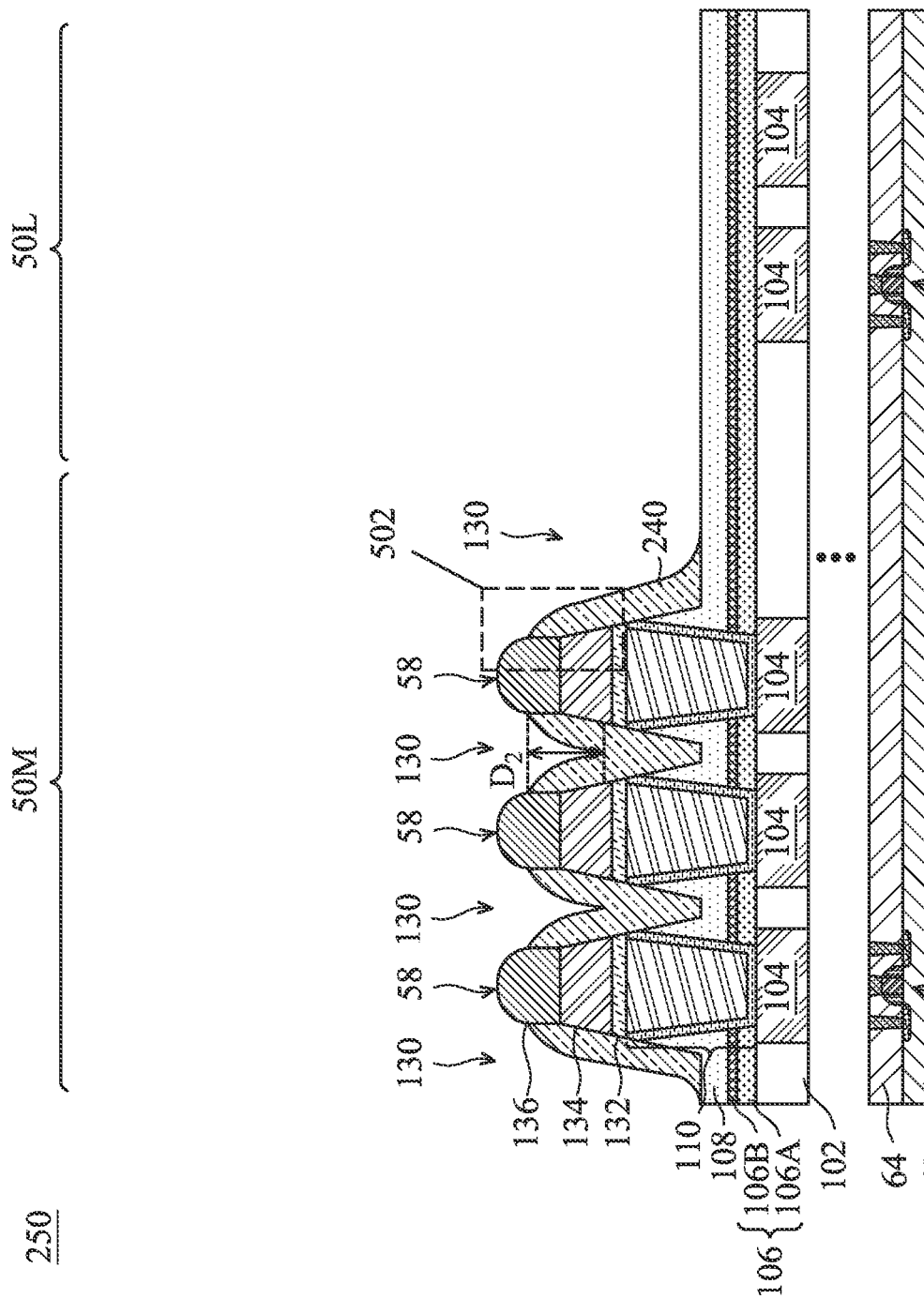
Figure 18B:
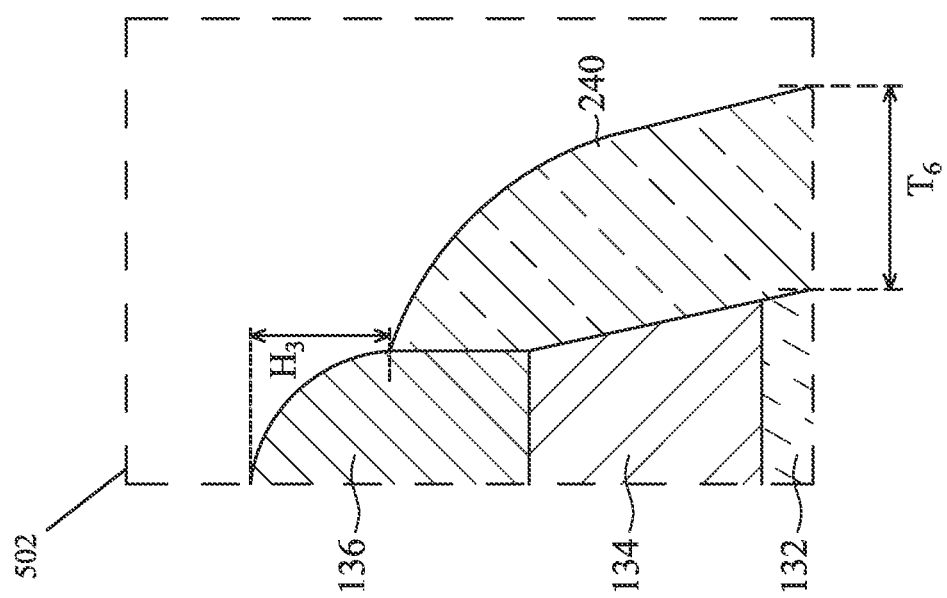
Figure 19:
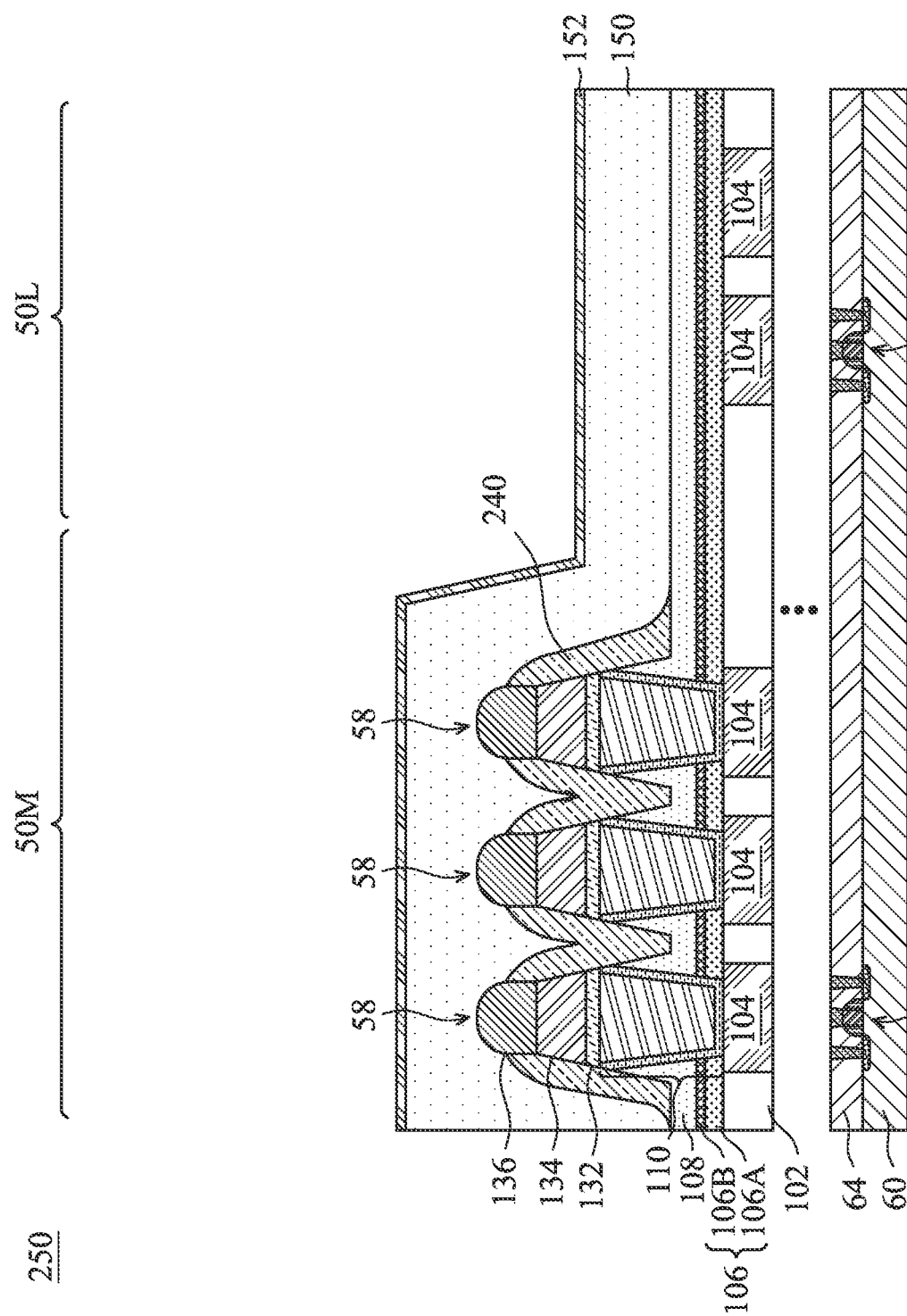
Figure 20:
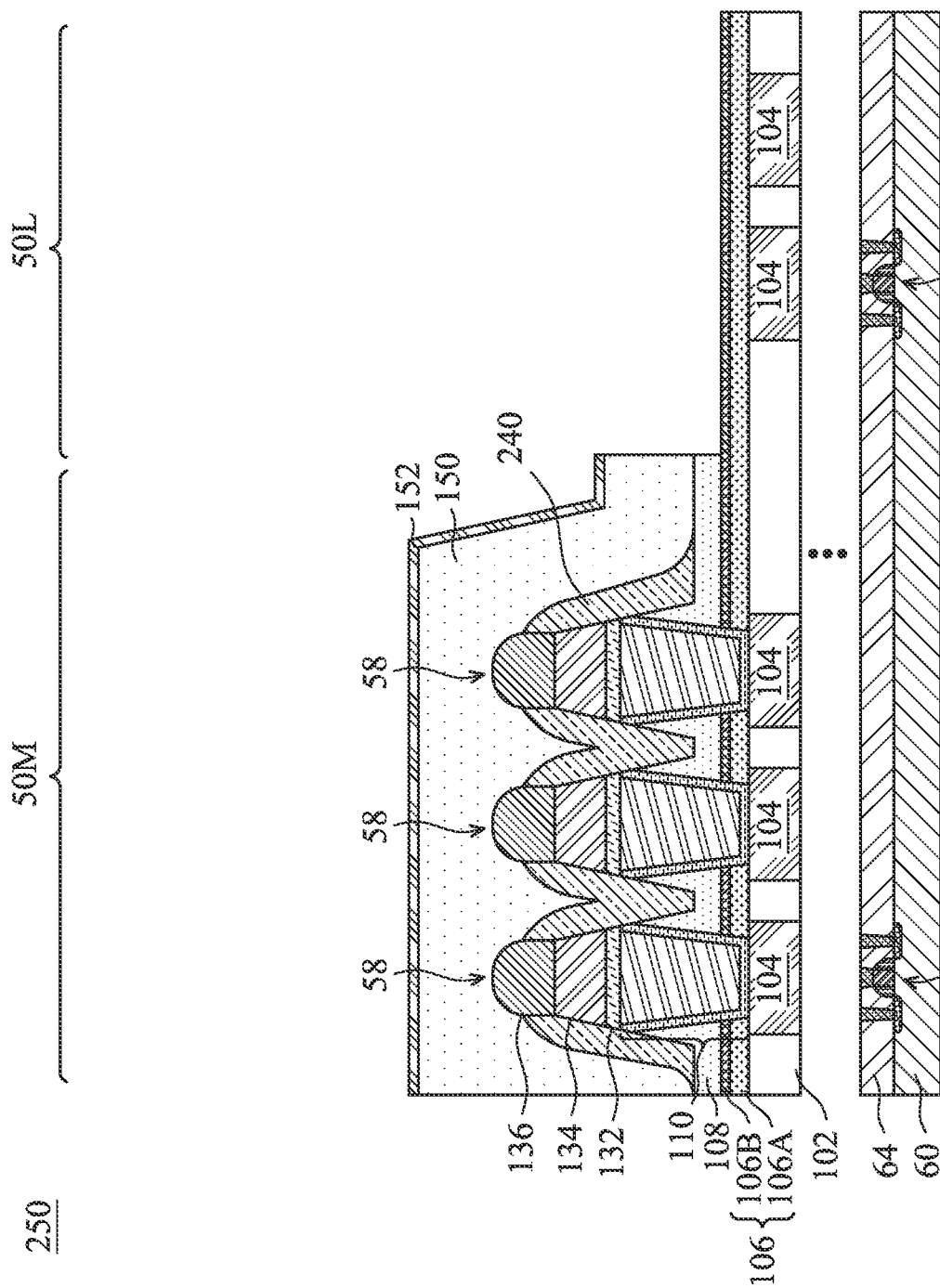
Figure 21:
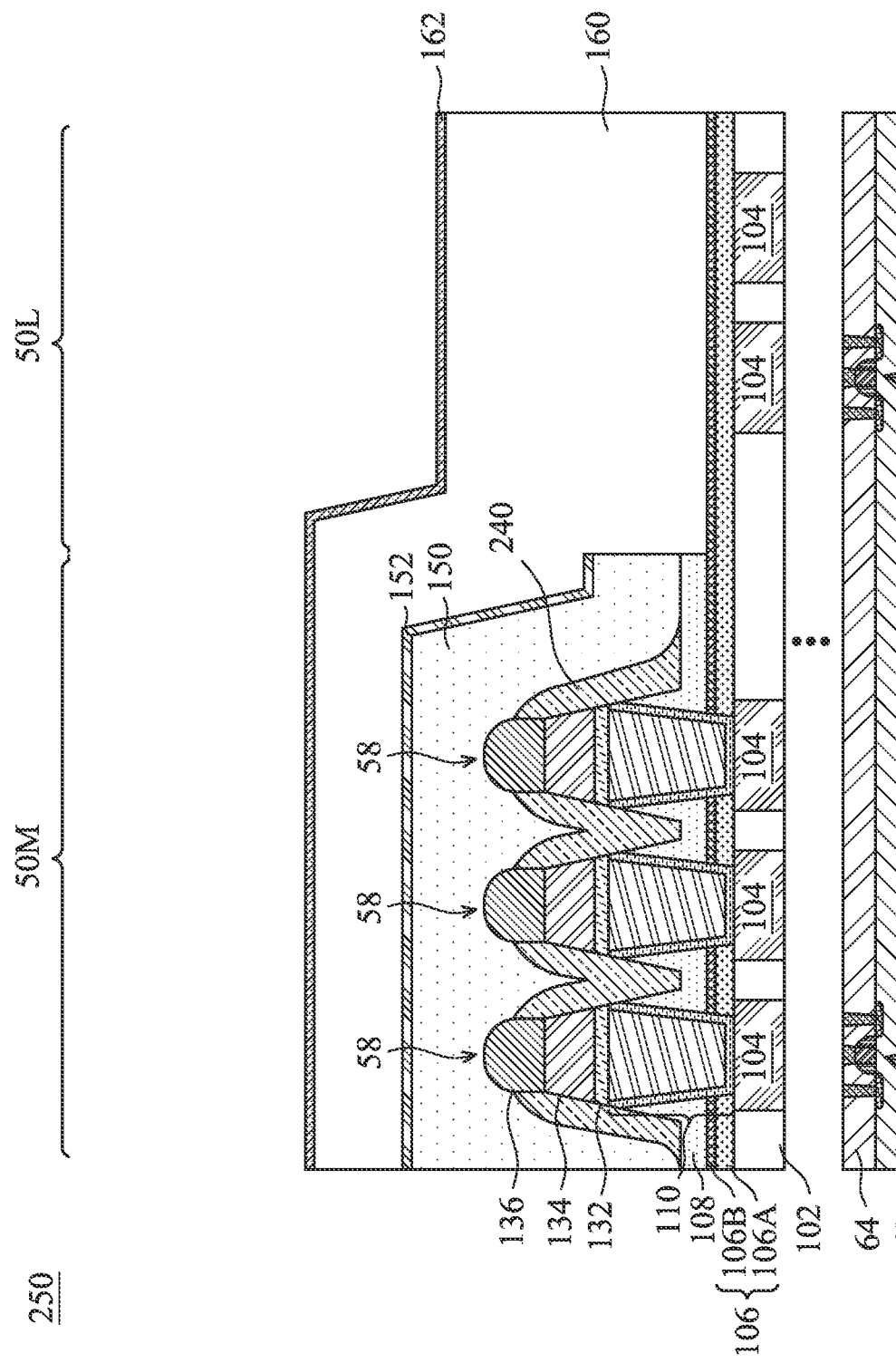
Figure 22:
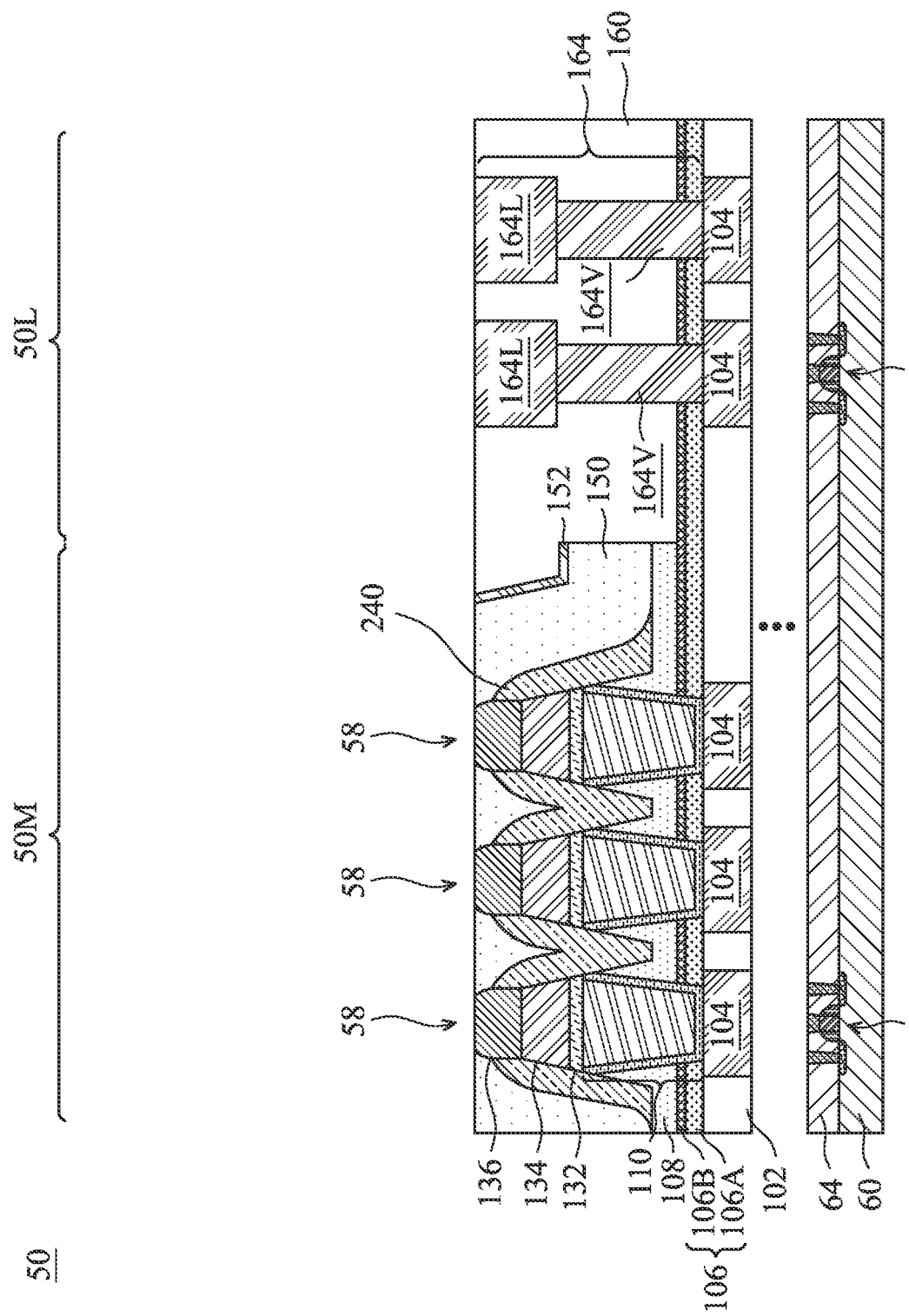

In FIGS. 18A and 18B, the passivation layer 242 is patterned to form spacers 240. FIG. 18B illustrates a detailed view of region 502 as illustrated in FIG. 18A. The patterning of the spacers 240 exposes top surfaces of the MRAM cells 58 to allow subsequent connection of the top electrodes 136 to subsequently formed conductive features (see below, FIG. 23A). The patterning removes horizontal portions of the passivation layer 242. The remaining portions of the passivation layer 242 form the spacers 240. The IMD layer 108 in the logic region 50L is exposed after the spacers 240 are patterned.

After the patterning, the top electrodes 136 may be exposed to a third height H3 below the top surface of the top electrodes 136 in a range of 30 Å to 500 Å, which may be advantageous for allowing subsequent electrical connection to the top electrodes 136 while protecting the sidewalls of the MTJ stacks 134 from moisture and hydrogen. Exposing the top electrodes to a third height H3 less than 30 Å may be disadvantageous for not allowing subsequent electrical connection to the top electrodes 136, leading to poorer device performance. Exposing the top electrodes to a third height H3 greater than 500 Å may be disadvantageous for insufficiently protecting the sidewalls of the MTJ stacks 134 from moisture and hydrogen.

After the patterning, the spacers 240 may have a sixth thickness $T_6$ in a range of 30 Å to 250 Å, which may be advantageous for reducing moisture and hydrogen diffusion into the MTJ stacks 134 during subsequent processing. Patterning the spacers 240 to a sixth thickness $T_6$ less than 30 Å may be disadvantageous by insufficiently reducing moisture and hydrogen diffusion into the MRAM cells 58. Patterning the spacers 240 to a sixth thickness $T_6$ greater than 250 Å may be disadvantageous by exceeding the spacing between adjacent MRAM cells 58.

The recesses 130 between the MRAM cells 58 may have a second depth $D_2$, measured between a top surface of the spacers 240 and a bottom point of the recesses 130, in a range of 30 Å to 300 Å after the patterning of the spacers 240. In some embodiments, the recesses 130 expose top surfaces of the IMD layer 108 between the MRAM cells 58.

FIGS. 19 through 23B show the semiconductor device 250 at similar states of processing as FIGS. 12 through 16B, respectively. The processing steps of the embodiment of FIGS. 19 through 23B may be similar to the processing steps of the embodiment of FIGS. 12 through 16B.

Figure 23A:
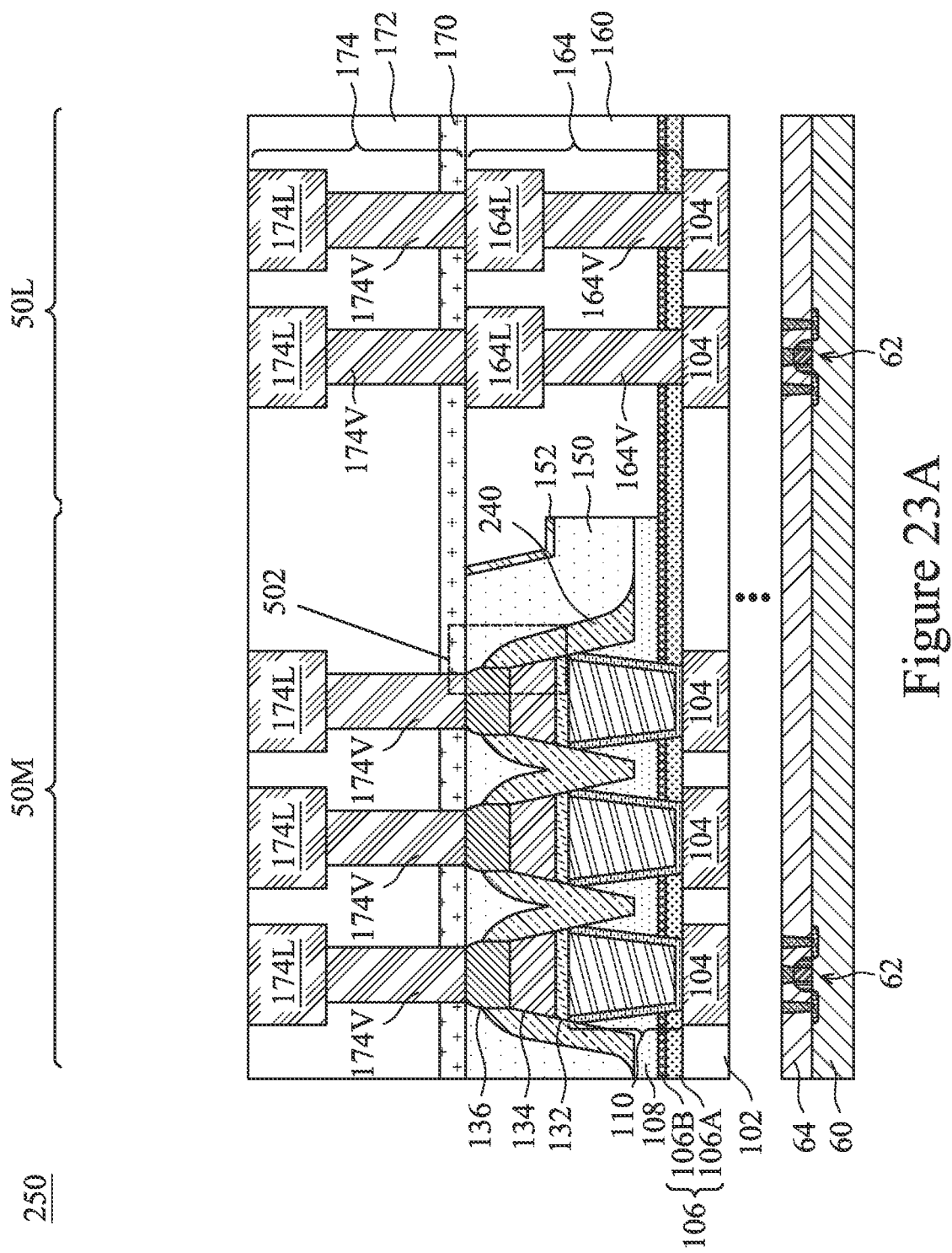
Figure 23B:
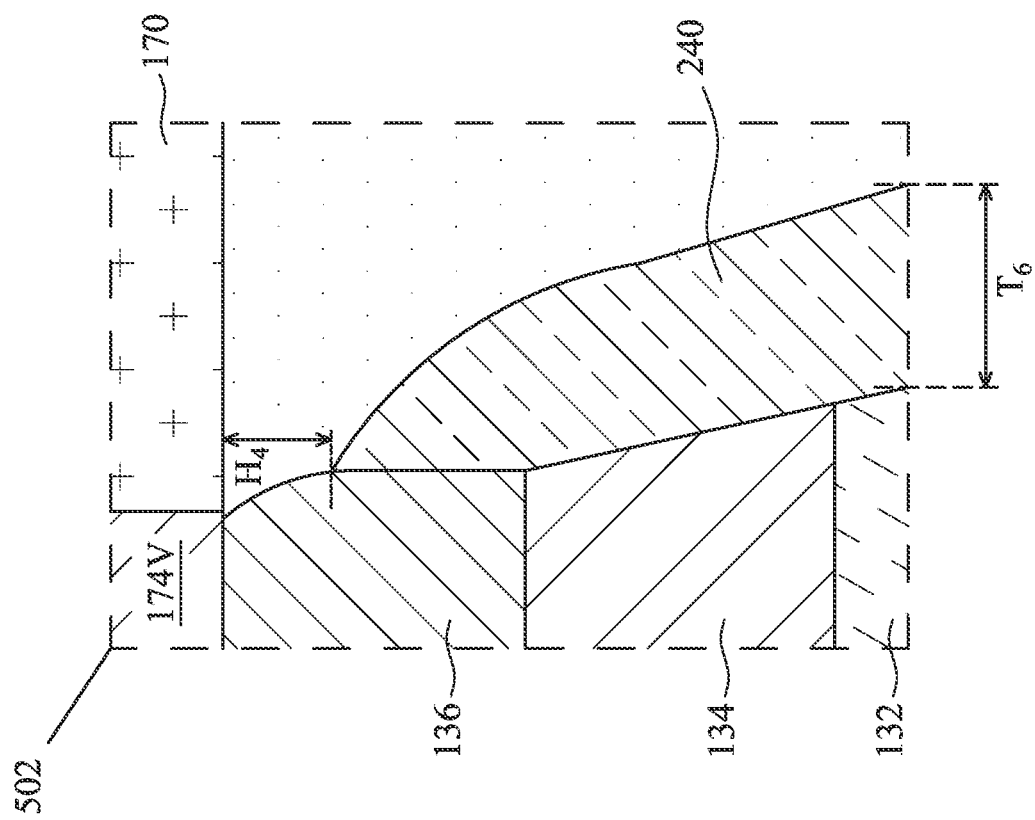

FIGS. 23A and 23B illustrate the semiconductor device 250 with another metallization layer of the interconnect structure (e.g., M6, see FIG. 2) formed over the metallization layer comprising the MRAM cells 58. FIG. 23B illustrates a detailed view of region 502 as illustrated in FIG. 23A. The embodiment of the semiconductor device 250 illustrated in FIGS. 23A and 23B may be similar to the embodiment of the semiconductor device 50 illustrated in FIGS. 16A and 16B, with spacers 240 comprising carbon replacing the spacers 140 of the semiconductor device 50.

FIG. 23B illustrates the spacers 240 after planarization. The spacers 240 are separated from the features of the overlying metallization layer (e.g., the etch stop layer 170 and the conductive features 174) by portions of the IMD layer 150. In some embodiments, the spacers 240 are disposed a fourth height H4 below the top surface of the top electrodes 136 in a range of 30 Å to 300 Å, which may be advantageous for allowing electrical connection to the top electrodes 136 with the conductive vias 174V while protecting the sidewalls of the MTJ stacks 134 from moisture and hydrogen during etching.

Embodiments may achieve advantages. MTJ stacks are used to form MRAM cells in memory regions of an interconnect structure. To protect sidewalls of MTJ stacks from moisture and hydrogen, spacers are formed around the MRAM cells, e.g., around the MTJ stacks. The spacers may include a metal layer to absorb moisture and hydrogen, with the metal layer being between nitride layers. The nitride layers may be formed to smaller thicknesses with the inclusion of the metal layer, which may reduce bombardment damage of the sidewalls of the MTJ stacks during formation of the nitride layers. The spacers may also comprise carbon, which can reduce bombardment damage of the sidewalls of the MTJ stacks during formation of the spacers and may increase the density of the spacers.

In accordance with an embodiment, a semiconductor device includes: a first conductive feature on a semiconductor substrate; a bottom electrode on the first conductive feature; a magnetic tunnel junction (MTJ) stack on the bottom electrode; a top electrode on the MTJ stack; and a spacer. The spacer includes: a first passivation layer contacting a sidewall of the top electrode, a sidewall of the MTJ stack, and a sidewall of the bottom electrode, the first passivation layer including a first dielectric material; a second passivation layer on the first passivation layer, the second passivation layer including a conductive material; and a third passivation layer on the second passivation layer, the second passivation layer including the first dielectric material. In an embodiment, the first dielectric material is silicon nitride. In an embodiment, the conductive material includes tantalum or magnesium. In an embodiment, the first passivation layer has a thickness in a range of 10 Å to 50 Å. In an embodiment, the second passivation layer has a thickness in a range of 5 Å to 20 Å. In an embodiment, the third passivation layer has a thickness in a range of 30 Å to 250 Å. In an embodiment, a thickness of the second passivation layer is less than a thickness of the first passivation layer and less than a thickness of the third passivation layer. In an embodiment, the semiconductor device further includes a dielectric layer on the spacer, the dielectric layer covering a sidewall of the top electrode. In an embodiment, the sidewall of the top electrode covered by the dielectric layer has a height in a range of 30 Å to 300 Å. In an embodiment, the dielectric layer covers a top surface of the second passivation layer.

In accordance with another embodiment, a semiconductor device includes: a first conductive feature on a semiconductor substrate; a bottom electrode on the first conductive feature; a magnetic tunnel junction (MTJ) stack on the bottom electrode; a top electrode on the MTJ stack; a spacer contacting a sidewall of the top electrode, a sidewall of the MTJ stack, and a sidewall of the bottom electrode, the spacer including amorphous carbon; and a conductive feature contacting the top electrode. In an embodiment, the spacer has a thickness in a range of 30 Å to 250 Å. In an embodiment, the semiconductor device of further includes a dielectric layer on the spacer, the dielectric layer covering a sidewall of the top electrode.

In accordance with yet another embodiment, a method includes: forming a bottom electrode layer over a semiconductor substrate; forming a magnetic tunnel junction (MTJ) film stack over the bottom electrode layer; forming a top electrode layer over the MTJ film stack; patterning the top electrode layer, the MTJ film stack, and the bottom electrode layer to form a magnetic random access memory (MRAM) cell; depositing a first nitride layer over the MRAM cell; depositing a metal layer over the first nitride layer; depositing a second nitride layer over the metal layer; and patterning the first nitride layer, the metal layer, and the second nitride layer to form a spacer on a sidewall of the MRAM cell, wherein the patterning exposes a top surface and a sidewall of the top electrode layer. In an embodiment, the second nitride layer is recessed to a height in a range of 30 Å to 500 Å below the top surface of the top electrode layer. In an embodiment, the metal layer includes tantalum, and the first nitride layer and the second nitride layer include silicon nitride. In an embodiment, forming the second nitride layer includes performing a plasma enhanced chemical vapor deposition process. In an embodiment, the plasma enhanced chemical vapor deposition process is performed using $SiH_4$ and $NH_3$ as precursors. In an embodiment, the method further includes depositing a dielectric layer over the spacer and the MRAM cell, the dielectric layer covering the sidewall of the top electrode layer. In an embodiment, the dielectric layer covers a portion of the top electrode layer having a height in a range of 30 Å to 300 Å.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
a first conductive feature on a semiconductor substrate;
a bottom electrode on the first conductive feature;
a magnetic tunnel junction (MTJ) stack on the bottom electrode;
a top electrode on the MTJ stack; and
a spacer comprising:
a first passivation layer contacting a sidewall of the top electrode, a sidewall of the MTJ stack, and a sidewall of the bottom electrode, the first passivation layer comprising a first dielectric material;
a second passivation layer on the first passivation layer, the second passivation layer comprising a conductive material; and
a third passivation layer on the second passivation layer, the third passivation layer comprising the first dielectric material.

2. The semiconductor device of claim 1, wherein the first dielectric material is silicon nitride.

3. The semiconductor device of claim 1, wherein the conductive material comprises tantalum or magnesium.

4. The semiconductor device of claim 1, wherein the first passivation layer has a thickness in a range of 10 Å to 50 Å.

5. The semiconductor device of claim 1, wherein the second passivation layer has a thickness in a range of 5 Å to 20 Å.

6. The semiconductor device of claim 1, wherein the third passivation layer has a thickness in a range of 30 Å to 250 Å.

7. The semiconductor device of claim 1, wherein a thickness of the second passivation layer is less than a thickness of the first passivation layer and less than a thickness of the third passivation layer.

8. The semiconductor device of claim 1, further comprising a dielectric layer on the spacer, the dielectric layer covering a sidewall of the top electrode.

9. The semiconductor device of claim 8, wherein the sidewall of the top electrode covered by the dielectric layer has a height in a range of 30 Å to 300 Å.

10. The semiconductor device of claim 8, wherein the dielectric layer covers a top surface of the second passivation layer.

11. A semiconductor device comprising:
a first conductive feature on a semiconductor substrate;
a bottom electrode on the first conductive feature;
a magnetic tunnel junction (MTJ) stack on the bottom electrode;
a top electrode on the MTJ stack;
a spacer contacting a sidewall of the top electrode, a sidewall of the MTJ stack, and a sidewall of the bottom electrode, the spacer comprising amorphous carbon;
a dielectric layer on the spacer, the dielectric layer covering a sidewall of the top electrode; and
a second conductive feature contacting the top electrode.

12. The semiconductor device of claim 11, wherein the spacer has a thickness in a range of 30 Å to 250 Å.

13. A semiconductor device comprising:
a magnetic random access memory (MRAM) cell over a semiconductor substrate, the MRAM cell comprising:
a bottom electrode;
a magnetic tunnel junction (MTJ) stack on the bottom electrode; and
a top electrode on the MTJ stack;

a spacer on a sidewall of the MRAM cell, the spacer comprising:
   a first nitride layer contacting the sidewall of the MRAM cell;
   a metal layer on the first nitride layer; and
   a second nitride layer on the metal layer; and
a dielectric layer over the spacer, the dielectric layer covering a sidewall of the top electrode.

14. The semiconductor device of claim 13, wherein the metal layer comprises tantalum.

15. The semiconductor device of claim 13, wherein the first nitride layer and the second nitride layer comprise silicon nitride.

16. The semiconductor device of claim 13, wherein the dielectric layer is in contact with a portion of the top electrode for a first height, the first height being in a range of 30 Å to 300 Å.

17. The semiconductor device of claim 13, wherein the dielectric layer covers a top surface of the metal layer.

18. The semiconductor device of claim 13, wherein a thickness of the metal layer is less than a thickness of the first nitride layer and less than a thickness of the second nitride layer.

19. The semiconductor device of claim 11, wherein the sidewall of the top electrode covered by the dielectric layer has a height in a range of 30 Å to 300 Å.

20. The semiconductor device of claim 13, wherein the dielectric layer covers a top surface of the metal layer.

* * * * *